(12) United States Patent
Ota et al.

(10) Patent No.: US 11,569,104 B2
(45) Date of Patent: Jan. 31, 2023

(54) SUBSTRATE PROCESSING APPARATUS AND SUBSTRATE PROCESSING METHOD

(71) Applicant: SCREEN Holdings Co., Ltd., Kyoto (JP)

(72) Inventors: Takashi Ota, Kyoto (JP); Masayuki Hayashi, Kyoto (JP); Jiro Okuda, Kyoto (JP); Akihiro Nakashima, Kyoto (JP)

(73) Assignee: SCREEN HOLDINGS CO., LTD.

( * ) Notice: Subject to any disclaimer, the term of this patent is extended or adjusted under 35 U.S.C. 154(b) by 156 days.

(21) Appl. No.: 16/979,194

(22) PCT Filed: Dec. 28, 2018

(86) PCT No.: PCT/JP2018/048469
§ 371 (c)(1),
(2) Date: Sep. 9, 2020

(87) PCT Pub. No.: WO2019/171734
PCT Pub. Date: Sep. 12, 2019

(65) Prior Publication Data
US 2021/0028032 A1    Jan. 28, 2021

(30) Foreign Application Priority Data

Mar. 9, 2018  (JP) .............................. JP2018-042932

(51) Int. Cl.
*H01L 21/67* (2006.01)
*H01L 21/306* (2006.01)
*H01L 21/66* (2006.01)

(52) U.S. Cl.
CPC ............ *H01L 21/67248* (2013.01); *H01L 21/30604* (2013.01); *H01L 21/6715* (2013.01); *H01L 22/10* (2013.01)

(58) Field of Classification Search
CPC ..................... H01L 21/67248; H01L 21/6708
See application file for complete search history.

(56) References Cited

U.S. PATENT DOCUMENTS

| 9,793,176 B2 | 10/2017 | Kobayashi et al. |
| 10,514,684 B2 | 12/2019 | Yamanaka |
| 10,636,682 B2 | 4/2020 | Kikumoto et al. |

(Continued)

FOREIGN PATENT DOCUMENTS

| CN | 1561473 A | * | 1/2005 | ............. F28D 7/024 |
| CN | 102648052 B | * | 9/2014 | ................ B01L 3/00 |

(Continued)

OTHER PUBLICATIONS

International Search Report dated Feb. 19, 2019 in corresponding PCT International Application No. PCT/JP2018/048469.

(Continued)

*Primary Examiner* — Jarrett J Stark
(74) *Attorney, Agent, or Firm* — Ostrolenk Faber LLP

(57) ABSTRACT

A substrate processing apparatus includes a temperature detector and a controller. The temperature detector detects a temperature of processing liquid before the temperature of the processing liquid in pre-dispensing in progress reaches a target temperature. The controller sets discharge stop duration of the processing liquid in the pre-dispensing based on target temperature prediction duration. The target temperature prediction duration is prediction duration until the temperature of the processing liquid reaches the target temperature from a detection temperature. The detection temperature is the temperature of the processing liquid detected by the temperature detector before the temperature of the processing liquid reaches the target temperature. The target temperature prediction duration is determined based on a temperature profile. The temperature profile indicates a record of the temperature of the processing liquid changing (Continued)

over time when the pre-dispensing processing was performed in the past according to the pre-dispensing condition.

16 Claims, 13 Drawing Sheets

(56) References Cited

U.S. PATENT DOCUMENTS

| | | |
|---|---|---|
| 2003/0138551 A1 | 7/2003 | Miyata .............................. 427/8 |
| 2010/0175714 A1 | 7/2010 | Nagai et al. ...................... 134/3 |
| 2012/0074102 A1 | 3/2012 | Magara et al. ................. 216/83 |
| 2016/0268146 A1 | 9/2016 | Kobayashi |
| 2016/0372341 A1 | 12/2016 | Kobayashi et al. |
| 2017/0160731 A1 | 6/2017 | Yamanaka |
| 2017/0271177 A1 | 9/2017 | Kikumoto et al. |
| 2019/0039709 A1* | 2/2019 | Crites .................... B32B 15/14 |

FOREIGN PATENT DOCUMENTS

| | | |
|---|---|---|
| EP | 1 770 761 B1 | 12/2009 |
| JP | 3992601 B2 * | 10/2007 ........... B05B 7/1666 |
| JP | 2012-074601 A | 4/2012 |
| JP | 2016-167568 A | 9/2016 |
| JP | 2017-011033 A | 1/2017 |
| JP | 2017-028120 A | 2/2017 |
| JP | 2017-168774 A | 9/2017 |
| TW | 201611088 A | 3/2016 |
| TW | 201709382 A | 3/2017 |

OTHER PUBLICATIONS

Written Opinion dated Feb. 19, 2019 in corresponding PCT International Application No. PCT/JP2018/048469.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of International Application No. PCT/JP2018/048469, filed Dec. 28, 2018, which claims priority to Japanese Patent Application No. 2018-042932, filed Mar. 9, 2018, the contents of both of which are incorporated herein by reference. The PCT International Application was published in the Japanese language.

TECHNICAL FIELD

The present invention relates to a substrate processing apparatus and a substrate processing method for processing a substrate using processing liquid.

BACKGROUND ART

A substrate processing apparatus described in Patent Literature 1 is a single-wafer type that processes substrates one by one. The substrate processing apparatus mixes, in a supply pipe, a phosphoric acid aqueous solution at room temperature and a high-temperature sulfuric acid aqueous solution with a temperature higher than a boiling point of the phosphoric acid aqueous solution to generate a mixture of phosphoric acid, sulfuric acid, and water. The phosphoric acid aqueous solution mixed with the sulfuric acid aqueous solution is heated by heat of the sulfuric acid aqueous solution. Further, the phosphoric acid aqueous solution and the sulfuric acid aqueous solution are mixed whereby heat of dilution is generated. The phosphoric acid aqueous solution mixed with the sulfuric acid aqueous solution is heated not only by the heat of the sulfuric acid aqueous solution but also by the heat of dilution. Therefore, the phosphoric acid aqueous solution contained in the mixture is heated to near the boiling point, and the mixture containing the phosphoric acid aqueous solution heated to near the boiling point is discharged onto the substrate. The mixture is hereinafter referred to as "processing liquid". It is consequently possible to attain a high selection ratio and a high etching rate in the case of etching of a substrate with a silicon nitride film formed thereon. After the etching is performed for a predetermined duration, a valve is closed to stop discharge of the processing liquid from the nozzle.

CITATION LIST

Patent Literature

[Patent Literature 1]
JP 2012-74601A

SUMMARY OF INVENTION

Technical Problem

However, in the substrate processing apparatus described in Patent Literature 1, when temperatures of processing liquid for substrates at a processing start time differ across the substrates, slight dispersion may occur in results of processing among the substrates. Each of the temperatures is hereinafter referred to as a "processing start temperature". In recent years, it may be required to inhibit even slight dispersion in the results of processing in particular. In other words, it may be required to further improve uniformity of results of processing among the substrates.

In particular, in the case where high-temperature processing liquid is used, there is a large difference between a temperature of an ambient environment around a substrate housed in the substrate processing apparatus and a temperature of processing liquid. A difference in the processing start temperatures across the substrates is therefore larger than that when non-high-temperature processing liquid is used. The temperature of the ambient environment is hereinafter referred to as an "environmental temperature".

For example, in the case of a general substrate processing device, in a processing liquid tank that stores processing liquid and a circulation pipe that allows the processing liquid to circulate in a preparatory stage for supply of the processing liquid to a substrate, measures are taken to adjust the processing liquid to a predetermined temperature. However, for example, the temperature of a supply pipe that branches from the circulation pipe and allows the processing liquid to be supplied to a nozzle may fluctuate across substrates. This causes subtle fluctuations in processing start temperatures among the substrates. There is consequently a problem that dispersion will occur in results of processing using processing liquid among the substrates despite the fact that a conventional device, particularly a conventional device that performs processing using high-temperature processing liquid makes temperature adjustments for the processing liquid tank and the circulation pipe.

Therefore, the inventors of the present application paid attention to a temperature of processing liquid in pre-dispensing to examine in detail a cause of dispersion occurring in results of processing among substrates.

A temperature of processing liquid in a general pre-dispensing will be described with reference to FIG. 13. FIG. 13 illustrates changes in temperatures of processing liquid in a general substrate processing device. In FIG. 13, a horizontal axis represents time and a vertical axis represents the temperatures of the processing liquid. A time t0 indicates a discharge start time of processing liquid in the pre-dispensing. A time t1 indicates a discharge stop time of processing liquid in the pre-dispensing. That is, the time t1 indicates an end time of the pre-dispensing. A time t2 indicates a start time of processing of substrates using their respective processing liquid. A temperature Tc indicates an environmental temperature.

A curve Ca1 depicts changes in temperatures of processing liquid in pre-dispensing and substrate processing for a first substrate. A curve Ca2 depicts changes in temperatures of processing liquid in pre-dispensing and substrate processing for a second substrate. A curve Ca3 depicts changes in temperatures of processing liquid in pre-dispensing and substrate processing for a third substrate.

The pre-dispensing is performed in a period of time PD from the time t0 to the time t1. The substrate processing is then performed using processing liquid in a period of time SP starting at the time t2.

Here, as depicted by the curve Ca1, processing liquid at the end time t1 of the pre-dispensing for the first substrate has a temperature Ta1. As depicted by the curve Ca2, processing liquid at the end time t1 of the pre-dispensing for the second substrate has a temperature Ta2. As depicted by the curve Ca3, processing liquid at the end time t1 of the pre-dispensing for the third substrate has a temperature Ta3.

The temperature Ta1 is lower than the temperature Ta2 and the temperature Ta3, and the temperature Ta2 is lower than the temperature Ta3. This is because a supply pipe branched from a circulation pipe has the lowest temperature when the processing liquid for the first substrate is supplied, and subsequently has a gradually rising temperature. When the substrate processing apparatus has a relatively long standby time in particular, a temperature of the supply pipe in the pre-dispensing for the first substrate is lower than those in the pre-dispensing for the second and subsequent substrates. Influence of the supply pipe in the pre-dispensing having different temperatures across the substrates is particularly remarkable when high-temperature processing liquid is used.

When respective temperatures Ta1 to Ta3 of the processing liquid at the end time t1 of the pre-dispensing differ across the three substrates, respective temperatures of the processing liquid at the start time t2 of the substrate processing also differ across the three substrates. There is consequently a possibility that slight dispersion will occur in results of processing among the three substrates.

As described above with reference to FIG. 13, the inventors of the present application have found there is a possibility that slight dispersion will occur in results of processing among substrates when there are differences across substrates in temperatures of their respective processing liquid at an end time of pre-dispensing.

Therefore, the inventors of the present application have earnestly studied a substrate processing apparatus and a substrate processing method from the viewpoint of pre-dispensing.

The present invention has been achieved in view of the above circumstances, and an object thereof is to provide a substrate processing apparatus and a substrate processing method capable of improving uniformity of results of processing using processing liquid among substrates.

Solution to Problem

A substrate processing apparatus according an aspect of the present invention processes a substrate using processing liquid. The substrate processing apparatus includes a substrate holding section, a nozzle, a supply adjustment section, a liquid receiving section, a temperature detector, and a controller. The substrate holding section holds and rotates the substrate. The nozzle discharges the processing liquid onto the substrate held. The supply adjustment section adjusts a supply amount of the processing liquid to the nozzle. The liquid receiving section is placed outside the substrate holding section and receives the processing liquid discharged from the nozzle. The temperature detector detects a temperature of the processing liquid before the temperature of the processing liquid in pre-dispensing in progress reaches a target temperature. The controller controls the supply adjustment section according to a pre-dispensing condition to perform the pre-dispensing. The pre-dispensing is discharging the processing liquid toward the liquid receiving section before the processing liquid is discharged onto the substrate. The controller sets discharge stop duration of the processing liquid in the pre-dispensing based on target temperature prediction duration. The target temperature prediction duration is prediction duration until the temperature of the processing liquid reaches the target temperature from a detection temperature. The detection temperature is a temperature of the processing liquid detected by the temperature detector before the temperature of the processing liquid reaches the target temperature. The target temperature prediction duration is determined based on a temperature profile. The temperature profile indicates a record of the temperature of the processing liquid changing over time when the pre-dispensing processing was performed in past according to the pre-dispensing condition.

In the substrate processing apparatus according to the aspect of the present invention, the controller preferably determines the target temperature prediction duration according to the detection temperature of the processing liquid based on the temperature profile.

In the substrate processing apparatus according to the aspect of the present invention, the temperature detector preferably detects that the temperature of the processing liquid has reached a predetermined temperature in the pre-dispensing in progress. The predetermined temperature is preferably lower than the target temperature. Preferably, when the target temperature prediction duration has elapsed since a time when it was detected that the temperature of the processing liquid had reached the predetermined temperature, the controller controls the supply adjustment section so that discharge of the processing liquid in the pre-dispensing is stopped.

In the substrate processing apparatus according to the aspect of the present invention, the temperature detector preferably detects the temperature of the processing liquid at a predetermined detection time in the pre-dispensing in progress. The predetermined detection time is preferably a time before the temperature of the processing liquid reaches the target temperature. Preferably, when the target temperature prediction duration has elapsed since the predetermined detection time, the controller controls the supply adjustment section so that discharge of the processing liquid in the pre-dispensing is stopped.

In the substrate processing apparatus according to the aspect of the present invention, the controller preferably controls the supply adjustment section according to the pre-dispensing condition selected from pre-dispensing conditions to perform the pre-dispensing. A pre-dispensing condition when temperature changing over time in the temperature profile is recorded is preferably the same as the pre-dispensing condition selected.

In the substrate processing apparatus according to the aspect of the present invention, in a case where a state of the substrate processing apparatus is a state indicated by state information, the temperature profile preferably indicates the record of the temperature of the processing liquid changing over time when the pre-dispensing was performed in past according to the pre-dispensing condition. The state information preferably includes at least one chosen from information indicating an elapsed time from completion of processing of a substrate processed immediately before and information indicating how many substrates have been held by the substrate holding section in order to be processed one by one.

In the substrate processing apparatus according to the aspect of the present invention, the processing liquid preferably contains phosphoric acid or a mixture of sulfuric acid and hydrogen peroxide.

The substrate processing apparatus according to the aspect of the present invention preferably further includes chambers. The substrate holding section, the nozzle, the supply adjustment section, the liquid receiving section, and the temperature detector are preferably provided for each of the chambers. The substrate holding section, the nozzle, the supply adjustment section, the liquid receiving section, and the temperature detector are preferably contained in each of the chambers. The controller preferably sets the discharge stop duration of the processing liquid in the pre-dispensing based on the target temperature prediction duration for each of the chambers.

A substrate processing method according to a different aspect of the present invention is implemented by a substrate processing apparatus that processes a substrate using processing liquid. The substrate processing method includes performing pre-dispensing according to a pre-dispensing condition. The pre-dispensing is discharging the processing liquid toward a liquid receiving section before the processing liquid is discharged onto the substrate. The performing pre-dispensing includes detecting a temperature of the processing liquid before the temperature of the processing liquid in the pre-dispensing in progress reaches a target temperature, and setting discharge stop duration of the processing liquid in the pre-dispensing based on target temperature prediction duration. The target temperature prediction duration is prediction duration until the temperature of the processing liquid reaches the target temperature from a detection temperature. The detection temperature is the temperature of the processing liquid detected, in the detecting, before the temperature of the processing liquid reaches the target temperature. The target temperature prediction duration is determined based on a temperature profile. The temperature profile indicates a record of the temperature of the processing liquid changing over time when the pre-dispensing was performed in past according to the pre-dispensing condition.

In the substrate processing method according to the different aspect of the present invention, in the setting, preferably the target temperature prediction duration according to the detection temperature of the processing liquid is determined based on the temperature profile.

In the substrate processing method according to the different aspect of the present invention, in the detecting, it is preferably detected that the temperature of the processing liquid in the pre-dispensing in progress has reached a predetermined temperature. The predetermined temperature is preferably lower than the target temperature. The performing pre-dispensing preferably further includes stopping discharge of the processing liquid in the pre-dispensing when the target temperature prediction duration has elapsed since a time when it was detected that the temperature of the processing liquid had reached the predetermined temperature.

In the substrate processing method according to the different aspect of the present invention, in the detecting, preferably the temperature of the processing liquid is detected at a predetermined detection time in the pre-dispensing in progress. The predetermined detection time is preferably a time before the temperature of the processing liquid reaches the target temperature. The performing pre-dispensing preferably further includes stopping discharge of the processing liquid in the pre-dispensing when the target temperature prediction duration has elapsed since the predetermined detection time.

In the substrate processing method according to the different aspect of the present invention, in the performing pre-dispensing, preferably the pre-dispensing is performed according to the pre-dispensing condition selected from pre-dispensing conditions. A pre-dispensing condition when temperature changing over time in the temperature profile is preferably recorded is the same as the pre-dispensing condition selected.

In the substrate processing method according to the different aspect of the present invention, in a case where a state of the substrate processing apparatus is a state indicated by state information, the temperature profile preferably indicates a record of the temperature of the processing liquid changing over time when the pre-dispensing was performed in past according to the pre-dispensing condition. The state information preferably includes at least one chosen from information indicating an elapsed time from completion of processing of a substrate processed immediately before and information indicating how many substrates have been held by a substrate holding section in order to be processed one by one.

In the substrate processing method according to the different aspect of the present invention, the processing liquid preferably contains phosphoric acid or a mixture of sulfuric acid and hydrogen peroxide.

In the substrate processing method according to the different aspect of the present invention, the performing pre-dispensing is preferably performed for each of chambers. The substrate is contained in each of the chambers.

Advantageous Effects of Invention

In the present invention, it is possible to improve uniformity of results of processing using the processing liquids among substrates.

DESCRIPTION OF EMBODIMENTS

Figure 1:
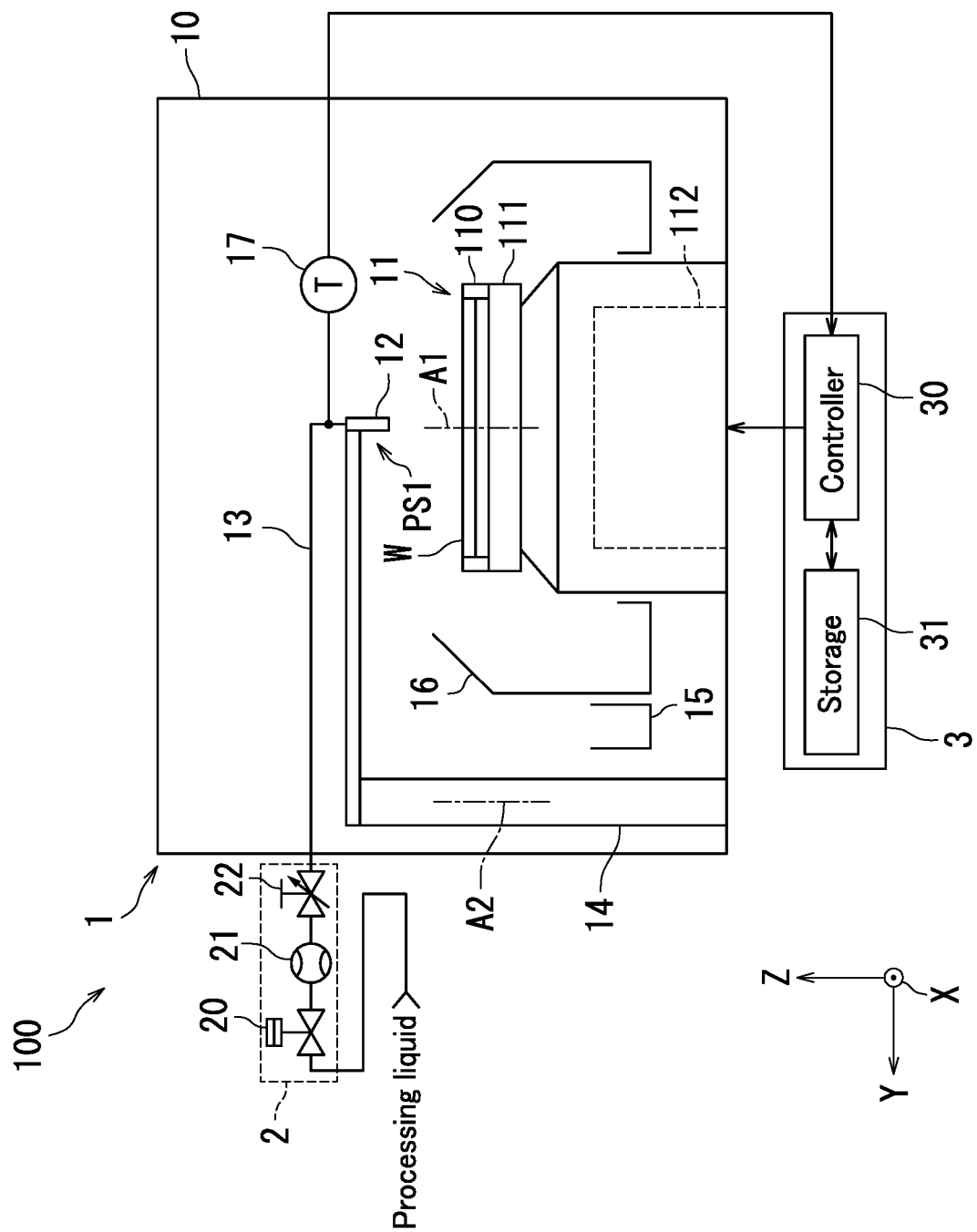
FIG. 1 illustrates a substrate processing apparatus according to a first embodiment of the present invention.

Embodiments of the present invention will hereinafter be described with reference to the accompanying drawings. In the drawings, the same or corresponding elements are assigned the same reference signs, and descriptions thereof are not repeated. In the embodiments of the present invention, an X axis, a Y axis, and a Z axis are perpendicular to one another, the X axis and the Y axis are parallel to a horizontal direction, and the Z axis is parallel to a vertical direction.

First Embodiment

A substrate processing apparatus 100 according to a first embodiment of the present invention will be described with reference to FIGS. 1 to 5. The substrate processing apparatus 100 will first be described with reference to FIG. 1. FIG. 1 illustrates the substrate processing apparatus 100. As illustrated in FIG. 1, the substrate processing apparatus 100 processes a substrate W using processing liquid. Specifically, the substrate processing apparatus 100 is a single-wafer type that processes substrates W one by one. Each of the substrates W has a substantially disc shape. The processing of the substrates W using processing liquid may hereinafter be referred to as "substrate processing".

The substrate processing apparatus 100 includes a processing unit 1, a supply adjustment section 2, and a control device 3.

The processing unit 1 processes a substrate W by discharging processing liquid onto the substrate W. Specifically, the processing unit 1 includes a chamber 10, a spin chuck 11, a nozzle 12, a supply pipe 13, a nozzle moving unit 14, a liquid receiving section 15, a cup 16, and a temperature detector 17.

The chamber 10 has a substantially box shape. The chamber 10 accommodates a substrate W, the spin chuck 11, the nozzle 12, part of the supply pipe 13, the nozzle moving unit 14, the liquid receiving section 15, the cup 16, and the temperature detector 17. The spin chuck 11 holds and rotates the substrate W. The spin chuck 11 corresponds to an example of a "substrate holding section". Specifically, the spin chuck 11 rotates the substrate W around a rotation axis A1 while holding the substrate W horizontally in the chamber 10. The spin chuck 11 includes chuck members 110, a spin base 111, and a spin motor 112. The chuck members 110 hold the substrate W in a horizontal posture. The spin base 111 has a substantially disc shape, and supports the chuck members 110 in a horizontal posture. The spin motor 112 rotates the spin base 111, thereby rotating the substrate W held by the chuck members 110 around the rotation axis A1.

The nozzle 12 discharges processing liquid toward the substrate W. The processing liquid is chemical liquid. For example, in the case where a substrate with a silicon nitride film formed thereon undergoes etching in the substrate processing apparatus 100, the processing liquid contains phosphoric acid. For example, in the case where the substrate processing apparatus 100 removes a resist, the processing liquid contains a sulfuric acid and hydrogen peroxide mixture (SPM). The processing liquid containing the phosphoric acid or the SPM is an example of processing liquid used at a high temperature.

The supply pipe 13 is connected to the nozzle 12. The supply pipe 13 supplies processing liquid to the nozzle 12. The temperature of the processing liquid supplied to the supply pipe 13 is kept at a specific temperature in a circulation pipe (not shown) placed upstream of the supply pipe 13. The specific temperature is equal to or higher than a prescribed temperature higher than room temperature. The prescribed temperature is hereinafter referred to as a "prescribed temperature TM". The prescribed temperature TM is a temperature at which a specified processing rate can be achieved for a substrate W. For example, the specified processing rate is a specified etching rate or a specified target removal rate. In other words, the prescribed temperature TM is a temperature at which a specified processing result can be achieved within specified time for the substrate W. For example, the specified processing result is a specified etching amount or a specified target removal amount. In the case of the processing liquid containing the phosphoric acid, the prescribed temperature TM is for example 175° C. In the case of the processing liquid containing the SPM, the prescribed temperature TM is for example 200° C.

The supply adjustment section 2 adjusts a supply amount of the processing liquid to the nozzle 12. The supply adjustment section 2 is placed in the supply pipe 13 outside the chamber 10. Note that the supply adjustment section 2 may be placed in the supply pipe 13 inside the chamber 10.

Specifically, the supply adjustment section 2 adjusts the supply amount of the processing liquid to the nozzle 12 to zero to stop supply of the processing liquid to the nozzle 12. The supply adjustment section 2 increases the supply amount of the processing liquid to the nozzle 12 more than zero to supply the processing liquid to the nozzle 12. The supply adjustment section 2 adjusts a flow amount of the processing liquid to be supplied to the nozzle 12.

More specifically, the supply adjustment section 2 includes a valve 20, a flowmeter 21, and a flow control valve 22. The valve 20 switches between starting and stopping supply of the processing liquid to the nozzle 12. Specifically, the valve 20 is an open/close valve and is allowed to switch between an opened state and a closed state. The opened state is a state that allows the processing liquid flowing inside the supply pipe 13 to pass toward the nozzle 12. The closed state is a state that stops supply of the processing liquid from the supply pipe 13 to the nozzle 12.

The flowmeter 21 detects a flow amount of the processing liquid supplied to the nozzle 12. The flow control valve 22 adjusts the flow amount of the processing liquid supplied to the nozzle 12. When coming into the opened state, the valve 20 allows the processing liquid to be supplied from the supply pipe 13 to the nozzle 12 at a flow amount corresponding to a valve travel of the flow control valve 22. The processing liquid is consequently discharged from the nozzle 12. The valve travel indicates a degree to which the flow control valve 22 is opened.

The cup 16 is cylindrical in shape. The cup 16 receives processing liquid flown out of the substrate W.

The temperature detector 17 detects a temperature of processing liquid inside the chamber 10. The temperature detector 17 then outputs information indicating the temperature of the processing liquid to the control device 3. In the first embodiment, the temperature detector 17 detects a temperature of processing liquid inside the supply pipe 13. Specifically, the temperature detector 17 detects the temperature of the processing liquid with a temperature measuring part (not shown) of the temperature detector 17 being in contact with the processing liquid inside the supply pipe 13. The temperature detector 17 may detect the temperature of the processing liquid inside the supply pipe 13 in the vicinity of the nozzle 12. Alternatively, the temperature detector 17 may detect the temperature of the processing liquid inside the supply pipe 13 in a position relatively away from the nozzle 12.

For example, the temperature detector 17 includes a temperature sensor. The temperature sensor includes for example, a thermocouple and a measuring instrument. Specifically, the thermocouple is inserted into the supply pipe 13. The thermocouple detects the temperature of the processing liquid inside the supply pipe 13 to output a voltage signal corresponding to the temperature to the measuring instrument. The measuring instrument converts the voltage signal into the temperature to output information indicating the temperature to the control device 3. The measuring instrument may be placed inside the chamber 10. Alternatively, the measuring instrument may be placed outside the chamber 10. A temperature measuring junction of the thermocouple may be located in the vicinity of the nozzle 12 within the supply pipe 13. Alternatively, the temperature measuring junction may be located in a position relatively away from the nozzle 12 within the supply pipe 13. The temperature measuring junction corresponds to the temperature measuring part of the temperature detector 17. Note that the temperature detector 17 may detect a temperature of an external surface of the supply pipe 13, thereby indirectly detecting the temperature of the processing liquid. For example, the temperature detector 17 may detect a temperature of the processing liquid inside the nozzle 12. Alternatively, temperature detector 17 may detect a temperature of an external surface of the nozzle 12, thereby indirectly detecting the temperature of the processing liquid.

As long as the temperature detector 17 detects the temperature of the processing liquid inside the chamber 10, the temperature detector 17 may detect a temperature of processing liquid in a position other than the supply pipe 13 and in a position other than the nozzle 12. For example, after processing liquid is discharged onto a substrate W, the temperature detector 17 may detect a temperature of the processing liquid on the substrate W. In order to detect the temperature of the processing liquid on the substrate W, the temperature detector 17 includes for example, a radiation thermometer or an infrared thermography. The radiation thermometer measures intensity of infrared rays or visible light emitted from the processing liquid discharged onto the substrate W to measure the temperature of the processing liquid discharged onto the substrate W. The radiation thermometer then outputs information indicating the temperature of the processing liquid to the control device 3. The infrared thermography includes an infrared camera. The infrared camera of the infrared thermography detects infrared rays emitted from the processing liquid discharged onto the substrate W. The infrared thermography further analyzes an image representing the detected infrared rays to calculate the temperature of the processing liquid discharged onto the substrate W. The infrared thermography then outputs information indicating the temperature of the processing liquid to the control device 3.

Figure 2:
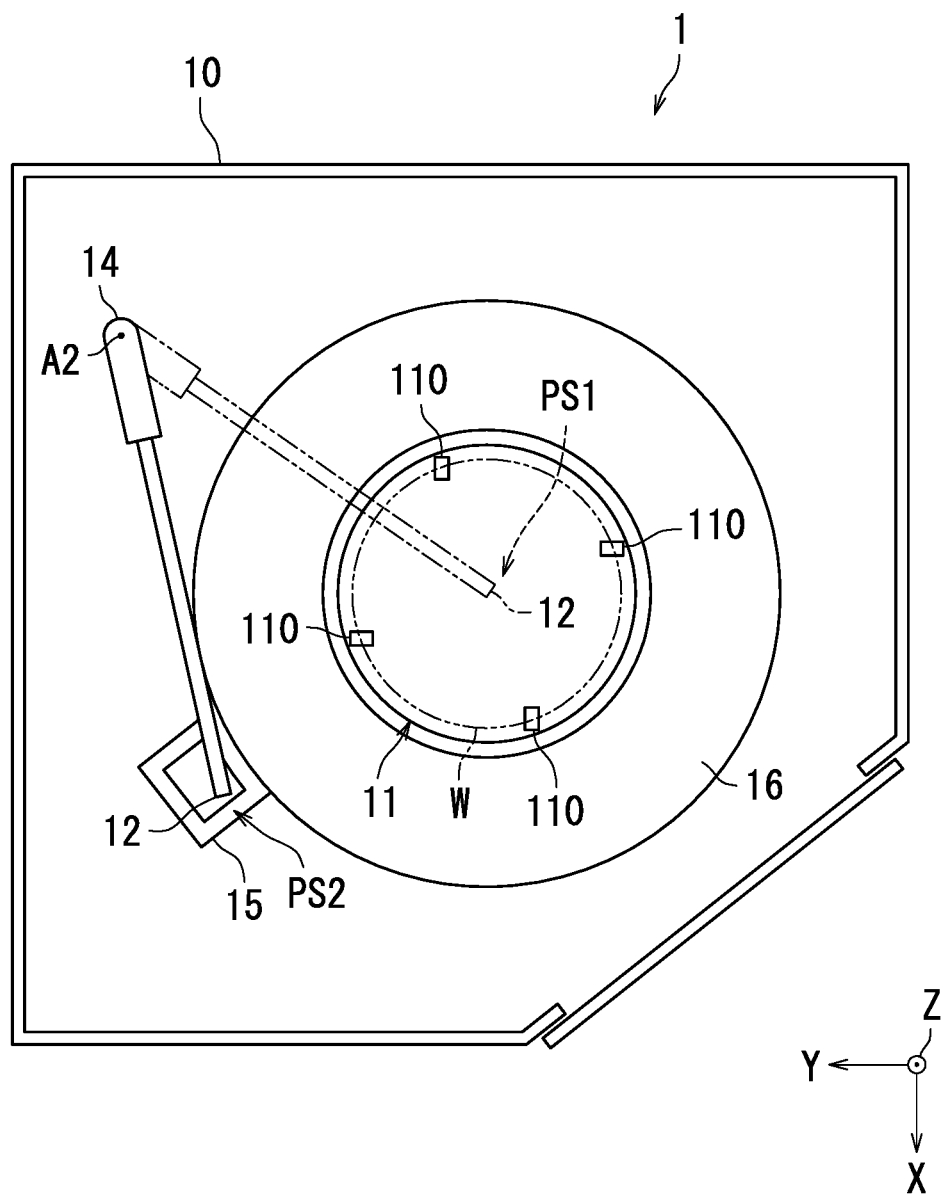
FIG. 2 is a plan view depicting an inside of a processing unit of the substrate processing apparatus according to the first embodiment.

The nozzle moving unit 14, the liquid receiving section 15, and the pre-dispensing will next be described with reference to FIGS. 1 and 2. FIG. 2 is a plan view depicting an inside of the processing unit 1. As illustrated in FIGS. 1 and 2, the nozzle moving unit 14 rotates around a rotational axis A2 to horizontally move the nozzle 12. Specifically, the nozzle moving unit 14 horizontally moves the nozzle 12 between a processing position PS1 and a standby position PS2 of the nozzle 12. The processing position PS1 is a position above the substrate W. In FIG. 2, the nozzle 12 in the processing position PS1 is depicted by a dashed and double dotted line. The standby position PS2 is a position outside the spin chuck 11 and the cup 16. The nozzle moving unit 14 can also vertically move the nozzle 12.

The liquid receiving section 15 is positioned outside the spin chuck 11 and the cup 16. Specifically, the liquid receiving section 15 is positioned below the standby position PS2 of the nozzle 12. The liquid receiving section 15 receives processing liquid discharged from the nozzle 12 in the pre-dispensing.

The pre-dispensing is discharging processing liquid toward the liquid receiving section 15 before processing liquid is discharged onto the substrate W. Specifically, when the substrate processing apparatus 100 performs the pre-dispensing, the nozzle moving unit 14 lowers the nozzle 12 from the standby position PS2 to move the nozzle 12 to the liquid receiving section 15. The nozzle 12 then discharges processing liquid toward the liquid receiving section 15.

The control device 3 and the pre-dispensing will be described still with reference to FIG. 1. As illustrated in FIG. 1, the control device 3 includes a controller 30 and storage 31. The controller 30 includes a processor such as a central processing unit (CPU). The storage 31 includes a storage device and stores data and computer programs. Specifically, the storage 31 includes main memory such as semiconductor memory, and an auxiliary storage device. Examples of the auxiliary storage device include semiconductor memory and a hard disk drive. The storage 31 may include a removable medium. The processor of the controller 30 executes a computer program stored in the storage device of the storage 31 to control the processing unit 1 and the supply adjustment section 2.

The controller 30 controls the supply adjustment section 2 and the nozzle moving unit 14 according to a pre-dispensing condition to perform the pre-dispensing. The pre-dispensing condition is a condition regarding processing liquid when the pre-dispensing is performed. Examples of the pre-dispensing condition include a flow amount and a type of the processing liquid discharged from the nozzle 12.

The temperature detector 17 detects a temperature of processing liquid before a temperature of processing liquid in the pre-dispensing in progress reaches a target temperature. The target temperature may hereinafter be referred to as a "target temperature Tt". The target temperature Tt is set to be a value that is equal to or higher than the prescribed temperature TM and that is equal to or lower than a saturation temperature of the processing liquid.

The controller 30 sets a discharge stop duration of the processing liquid in the pre-dispensing based on target temperature prediction duration. The target temperature prediction duration is prediction duration until the temperature of the processing liquid reaches the target temperature Tt from a detection temperature. The detection temperature may hereinafter be referred to as a "detection temperature Td". The detection temperature Td is a temperature of the processing liquid detected by the temperature detector 17 before the temperature of the processing liquid reaches the target temperature Tt. The target temperature prediction duration is also determined based on a temperature profile. The temperature profile may hereinafter be referred to as a "temperature profile PF". The temperature profile PF indicates a record of temperatures of processing liquid changing over time when the pre-dispensing processing was performed in the past according to the pre-dispensing condition. The pre-dispensing condition when the temperatures changing over time in the temperature profile PF is recorded is the same as the pre-dispensing condition for the pre-dispensing in progress. The storage 31 stores the temperature profile PF.

As described above with reference to FIG. 1, the controller 30 in the first embodiment sets the discharge stop duration of the processing liquid in the pre-dispensing based on the target temperature prediction duration. In the pre-dispensing, the processing liquid is therefore discharged until the temperature of the processing liquid reaches the target temperature Tt. As a result, in the case where the processing unit 1 processes substrates W one by one, it is possible to inhibit temperatures of processing liquid at the end time of the pre-dispensing from differing across the substrates W.

Since it is possible to inhibit the temperatures of the processing liquid at the end time of the pre-dispensing from differing across the substrates W, it is possible to inhibit temperatures of processing liquid at a processing start time of the substrates W from differing across the substrates W. Each of the temperatures of the processing liquid may hereinafter be referred to as a "processing start temperature". It is consequently possible to improve uniformity of results of processing using the processing liquid among the substrates W. In other words, it is possible to inhibit dispersion occurring in the results of processing using the processing liquid among the substrates W.

Specifically, the controller 30 sets the target temperature prediction duration to the discharge stop duration of the processing liquid in the pre-dispensing. The discharge stop duration of the processing liquid is a time from a detection time of the detection temperature Td to a discharge stop time of the processing liquid in the pre-dispensing. The discharge stop time of the processing liquid in the pre-dispensing is an end time of the pre-dispensing.

Figure 3:
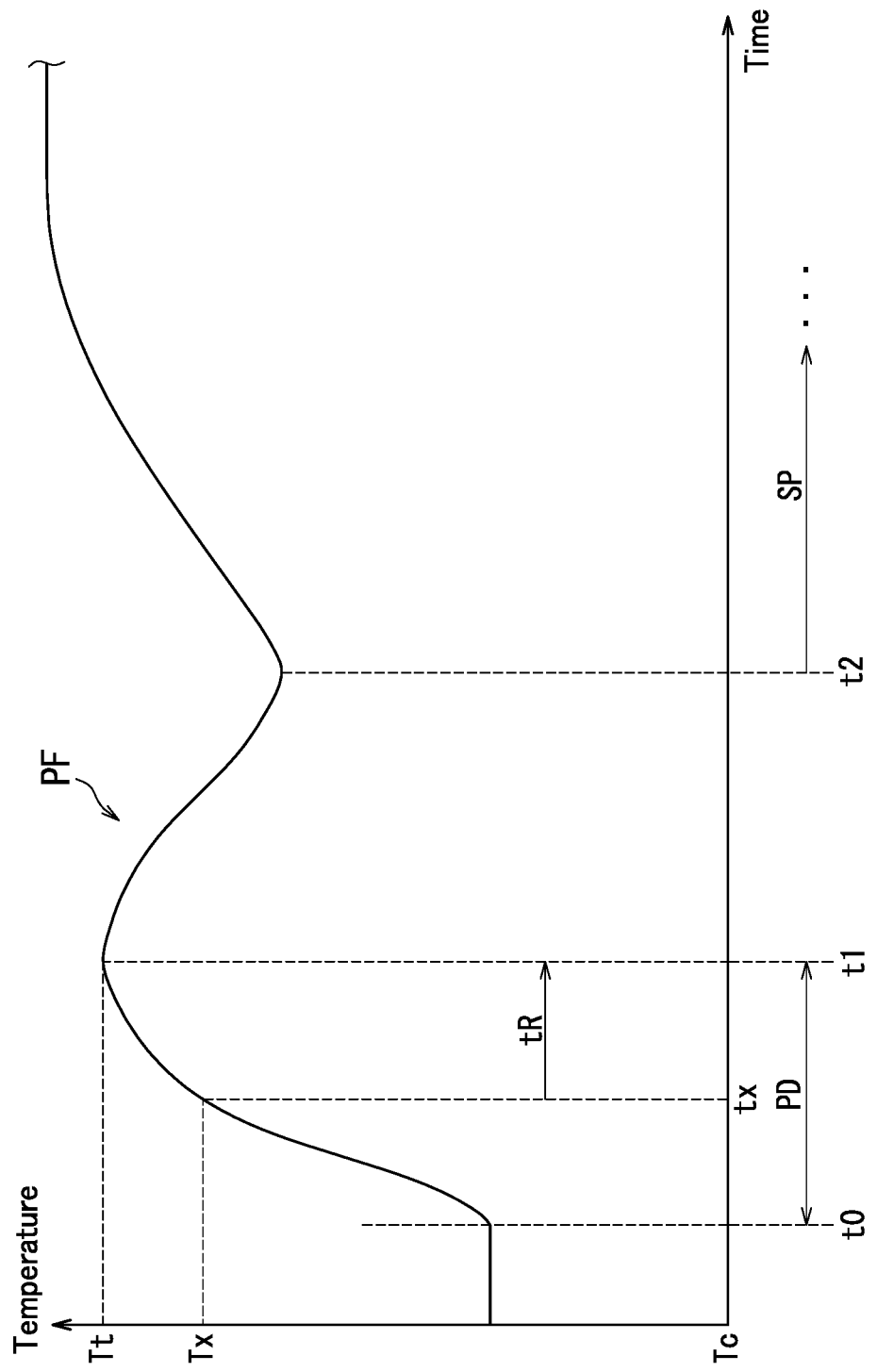
FIG. 3 illustrates a temperature profile of the substrate processing apparatus according to the first embodiment.

The temperature profile PF will next be described in detail with reference to FIG. 3. FIG. 3 illustrates the temperature profile PF. As illustrated in FIG. 3, a horizontal axis represents time and a vertical axis represents temperature. The temperature of processing liquid is detected by the temperature detector 17. The temperature profile PF is a record of changes in temperatures of processing liquid in pre-dispensing in the past. A time t0 indicates a discharge start time of a processing liquid in the pre-dispensing. That is, the time t0 indicates a start time of the pre-dispensing. A time t1 indicates is a time when the temperature of the processing liquid in the pre-dispensing reaches the target temperature Tt. In the first embodiment, discharge of the processing liquid in the pre-dispensing is stopped at a time when the temperature of the processing liquid in the pre-dispensing reaches the target temperature Tt. The time t1 is therefore a discharge stop time of the processing liquid and indicates an end time of the pre-dispensing. That is, the pre-dispensing is performed in a period of time PD from the time t0 to the time t1.

A time tx is a time when the temperature of the processing liquid in the pre-dispensing reaches a temperature Tx lower than the target temperature Tt. Duration tR until the temperature of the processing liquid reaches the target temperature Tt from the temperature Tx can be specified from the temperature profile PF. The duration tR may hereinafter be referred to as "target temperature arrival duration tR". The target temperature arrival duration tR is duration from the time tx to the time t1 in the temperature profile PF.

In the first embodiment, the controller 30 sets the target temperature arrival duration tR to the target temperature prediction duration in the pre-dispensing in progress. The target temperature arrival duration tR is specified from the temperature profile PF that is a record of the pre-dispensing in the past. That is, in the case where a detection temperature Td of the processing liquid in the pre-dispensing in progress substantially matches a temperature Tx in the temperature profile PF, it can be predicted that the temperature of the processing liquid in the pre-dispensing in progress will reach the target temperature Tt from the detection temperature Td when the target temperature arrival duration tR in the temperature profile PF has elapsed since a detection time of the detection temperature Td.

As described above with reference to FIG. 3, the controller 30 in the first embodiment determines the target temperature prediction duration according to the detection temperature Td of the processing liquid based on the temperature profile PF. It is therefore possible to precisely determine the target temperature prediction duration.

Note that in addition to the record of the temperature of the processing liquid changing over time when the pre-dispensing in the past was performed, the temperature profile PF may include a record of temperature of processing liquid changing over time from the end time t1 of the pre-dispensing to a start time t2 of processing of a substrate W using processing liquid, and a record of temperature of the processing liquid changing over time when the substrate W was processed using the processing liquid in the past.

That is, when the pre-dispensing ends, the nozzle 12 moves from the standby position PS2 to the processing position PS1 from the time t1 until the time t2. Therefore, in the temperature profile PF, the temperature of the processing liquid decreases from the time t1 until the time t2. The nozzle 12 then starts discharge of processing liquid toward a substrate W at the time t2. Therefore, in the temperature profile PF, the temperature of the processing liquid starts to increase at the time t2 and subsequently becomes saturated. The time t2 indicates the start time of processing of the substrate W using the processing liquid. That is, the substrate W is processed using the processing liquid in the period of time SP starting at the time t2.

Figure 4:
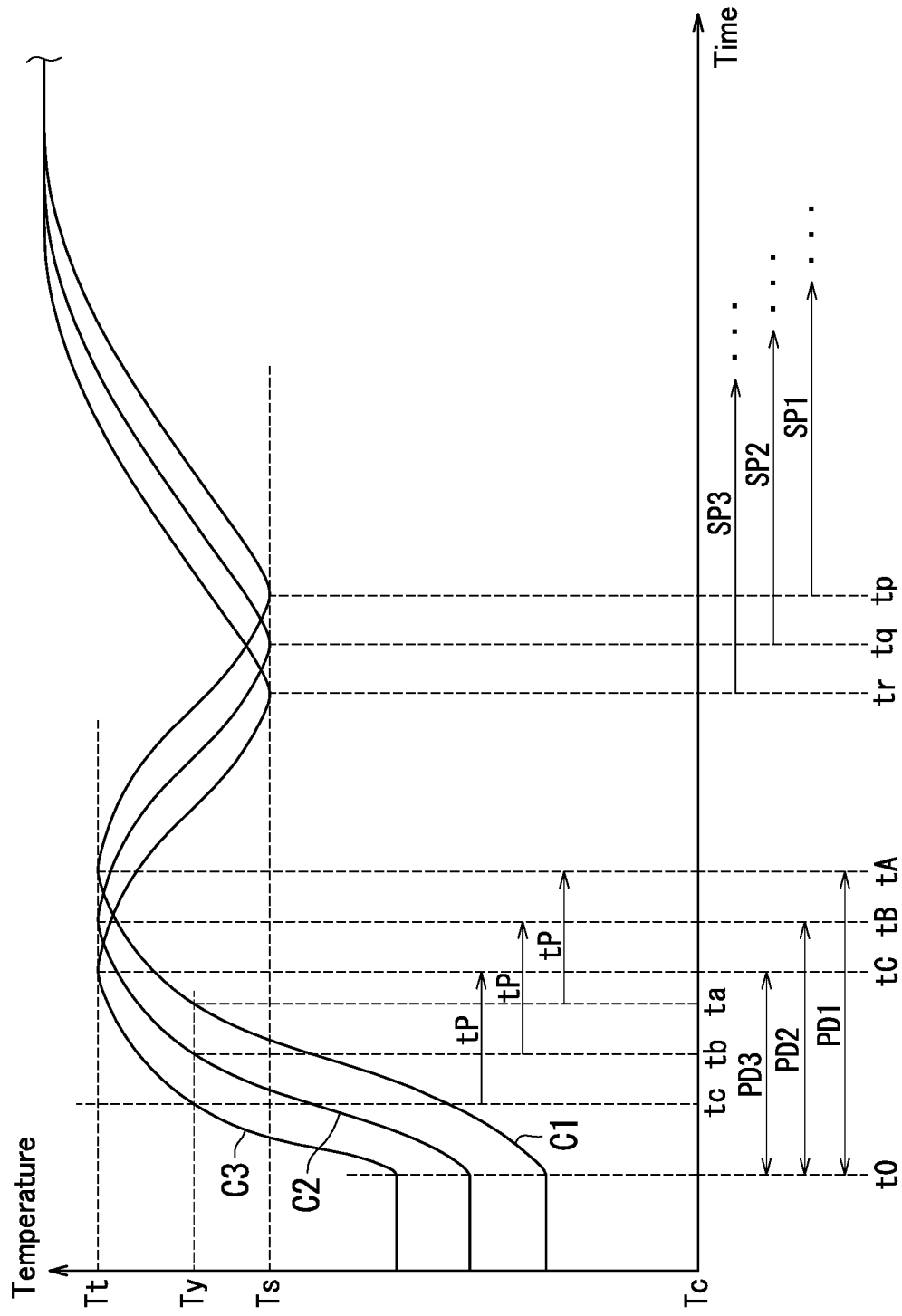
FIG. 4 illustrates changes in temperatures of processing liquid in the substrate processing apparatus according to the first embodiment.

Control of discharge of processing liquid in the pre-dispensing in progress will next be described with reference to FIGS. 1, 3, and 4. FIG. 4 illustrates changes in temperatures of processing liquid in the processing unit 1. As illustrated in FIG. 4, the horizontal axis represents time and the vertical axis represents temperature of processing liquid.

FIG. 4 illustrates changes in temperatures of processing liquid when three substrates W are processed one by one. That is, a curve C1 depicts changes in temperatures of processing liquid in pre-dispensing and substrate processing for a first substrate W. A curve C2 depicts changes in temperatures of processing liquid in pre-dispensing and substrate processing for a second substrate W. A curve C3 depicts changes in temperature of processing liquid in pre-dispensing and substrate processing for a third substrate W. A time t0 is a discharge start time of processing liquid in the pre-dispensing.

As depicted by the curve C1 to the curve C3, at the time t0, the processing liquid for the first substrate W has the lowest temperature, the processing liquid for the second substrate W has the next lowest temperature, and the processing liquid for the third substrate W has the highest temperature. This is because the supply pipe 13 branched from the circulation pipe (not shown) has the lowest temperature when the processing liquid for the first substrate W is supplied, and subsequently has a gradually rising temperature. When the processing unit 1 has a relatively long standby time in particular, a temperature of the supply pipe 13 in the pre-dispensing for the first substrate W is lower than those in the pre-dispensing for the second and subsequent substrates W.

Therefore, based on a result of detection by the temperature detector 17, the controller 30 controls discharge duration of the processing liquid in the pre-dispensing for each of the three substrates W so that temperatures of processing liquid at end times of the pre-dispensing are uniform across the three substrates W.

Specifically, the temperature detector 17 detects, for each substrate W, that the temperature of the processing liquid in the pre-dispensing in progress has reached a predetermined temperature Ty. The predetermined temperature Ty is lower than the target temperature Tt. As depicted by the curve C1, the temperature of the processing liquid for the first substrate W reaches the predetermined temperature Ty at a time ta. As depicted by the curve C2, the temperature of the processing liquid for the second substrate W reaches the predetermined temperature Ty at a time tb. As depicted by the curve C3, the temperature of the processing liquid for the third substrate W reaches the predetermined temperature Ty at a time tc.

The controller 30 refers to the temperature profile PF depicted in FIG. 3 to specify the target temperature arrival duration tR based on a temperature Tx that matches the predetermined temperature Ty. The controller 30 then sets the target temperature arrival duration tR to target temperature prediction duration tP. That is, based on the temperature profile PF, the controller 30 determines the target temperature prediction duration tP according to the predetermined temperature Ty that is the detection temperature Td.

The controller 30 then controls the supply adjustment section 2 (specifically the valve 20) so that discharge of the processing liquid in the pre-dispensing is stopped when the target temperature prediction duration tP has elapsed since a time when it was detected that the temperature of the processing liquid had reached the predetermined temperature Ty. Specifically, as depicted by the curve C1, the nozzle 12 stops discharge of the processing liquid for the first substrate W at a time tA when the target temperature prediction duration tP has elapsed since the time ta. As depicted by the curve C2, the nozzle 12 stops discharge of the processing liquid for the second substrate W at a time tB when the target temperature prediction duration tP has elapsed since the time tb. As depicted by the curve C3, the nozzle 12 stops discharge of the processing liquid for the third substrate W at a time tC when the target temperature prediction duration tP has elapsed since the time tc.

Thus, in the first embodiment, the temperatures of the processing liquid for the three substrates W at the end times tA to tC in the pre-dispensing are substantially the same as the target temperature Tt. That is, it is possible to inhibit the temperatures of the processing liquid at the end times tA to tC in the pre-dispensing from differing across the three substrates W. It is therefore possible to inhibit respective processing start temperatures of the substrates W from differing across the three substrates W. Specifically, as illustrated by the curves C1 to C3, a processing start temperature at a processing start time tp of the first substrate W, a processing start temperature at a processing start time tq of the second substrate W, and a processing start temperature at a processing start time tr of the third substrate W match a temperature Ts and substantially the same as one another. It is consequently possible to improve uniformity of results of processing using the processing liquid among the three substrates W.

In the first embodiment, duration of the pre-dispensing for the first substrate W from the end time tA to the processing start time tp , duration of the pre-dispensing for the second substrate W from the end time tB to the processing start time tq, and duration of the pre-dispensing for the third substrate W from the end time tC to the processing start time tr are substantially the same as one another. The processing of the first substrate W using the processing liquid is then performed in a period of time SP1 starting at the processing start time tp. The processing of the second substrate W using the processing liquid is performed in a period of time SP2 starting at the processing start time tq. The processing of the third substrate W using the processing liquid is performed in a period of time SP3 starting at the processing start time tr. The length of the period of time SP1, the length of the period of time SP2, and the length of the period of time SP3 are substantially the same as one another. Therefore, the three substrates W are respectively processed using their respective processing liquid having substantially the same processing start temperature Ts in the periods of time SP1 to SP3 having substantially the same length. It is consequently possible to improve uniformity of results of processing using the processing liquid among the three substrates W.

Moreover, in the first embodiment, as the processing liquid at the discharge start time t0 in the pre-dispensing has a lower temperature, a period of time during which the pre-dispensing is performed is made longer. As illustrated by the curves C1 and C2, the period of time PD1 during which the pre-dispensing for the first substrate W is performed is longer than the period of time PD2 during which the pre-dispensing for the second substrate W is performed. Also as illustrated by the curves C2 and C3, the period of time PD2 during which the pre-dispensing for the second substrate W is performed is longer than the period of time PD3 during which the pre-dispensing for the third substrate W is performed. It is therefore possible to further inhibit temperatures of the processing liquid at the end times tA to tC in the pre-dispensing from differing across the three substrates W. It is consequently possible to improve uniformity of results of processing using the processing liquid among the three substrates W.

As described above with reference to FIGS. 3 and 4, in the first embodiment, it is possible to improve uniformity of results of processing using processing liquid among substrates W.

The pre-dispensing in the first embodiment is particularly effective when high-temperature processing liquid is used. For example, the high-temperature processing liquid is processing liquid containing phosphoric acid or processing liquid containing SPM. This is because in the case where high-temperature processing liquid is used, a difference between an environmental temperature and a temperature of the processing liquid is generally large and therefore differences in temperatures of processing liquid for the substrates W at end times of the pre-dispensing in this case become larger than those in the case where non-high-temperature processing liquid is used. In the first embodiment, even when high-temperature processing liquid is used, it is possible to inhibit temperatures of the processing liquids at end times in the pre-dispensing from differing across substrates W and therefore to improve uniformity of results of processing using the processing liquid among the substrates W.

Here, fluctuations in environmental temperature around a substrate will be described taking a general substrate processing apparatus as an example. In the general substrate processing device, there is a possibility that slight dispersion will occur in results of processing among substrates due to fluctuations in environmental temperature. Specifically, fluctuations in environmental temperature around a substrate being processed may slightly affect the temperature of processing liquid thereof. When high-temperature processing liquid is used in particular, a difference between the environmental temperature and the temperature of the processing liquid is large and therefore influence of the fluctuations in environmental temperature is larger than that when non-high-temperature processing liquid is used. When the fluctuations in environmental temperature even slightly affect the temperature of the processing liquid, slight dispersion may occur in results of processing among the substrates. It may particularly be required to inhibit even slight dispersion in results of processing in recent years. In other words, it may be required to further improve uniformity of results of processing among substrates.

In contrast, the substrate processing apparatus 100 according to the first embodiment sets the discharge stop duration of the processing liquid in the pre-dispensing based on the target temperature prediction duration, thereby enabling inhibiting temperatures of the processing liquid at the end times in the pre-dispensing from differing across the substrates W. It is therefore possible to improve uniformity of results of processing using the processing liquid among the substrates W.

Moreover, in the first embodiment, discharge of the processing liquid in the pre-dispensing is controlled based on the detection temperature Td lower than the target temperature Tt. Therefore, the first embodiment has the following advantages as compared to discharge of the processing liquid in the pre-dispensing being controlled based on a target temperature Tt detected.

That is, in the first embodiment, the discharge of the processing liquid can be surely controlled because control of the discharge of the processing liquid is started at a time before a time when the temperature of the processing liquid reaches the target temperature Tt. Note that in the case where the discharge of the processing liquid is controlled based on a target temperature Tt detected, although the control needs to start just after the temperature of the processing liquid reaches the target temperature Tt, there is a possibility that the valve in operation will fail to follow the control to stop discharge of the processing liquid after the temperature of the processing liquid exceeds the target temperature Tt.

Moreover, in the first embodiment, the discharge of the processing liquid is controlled based on a detection temperature Td lower than the target temperature Tt, and it is therefore possible to detect the temperature of the processing liquid in a selected temperature range suitable for performance of the temperature detector 17. Although precision of detection by the temperature detector 17 in a high-temperature range may be insufficient in the case where high-temperature processing liquid is used in particular, in the first embodiment, it is possible to detect a temperature of processing liquid in a temperature range suitable for performance of the temperature detector 17.

Figure 5:
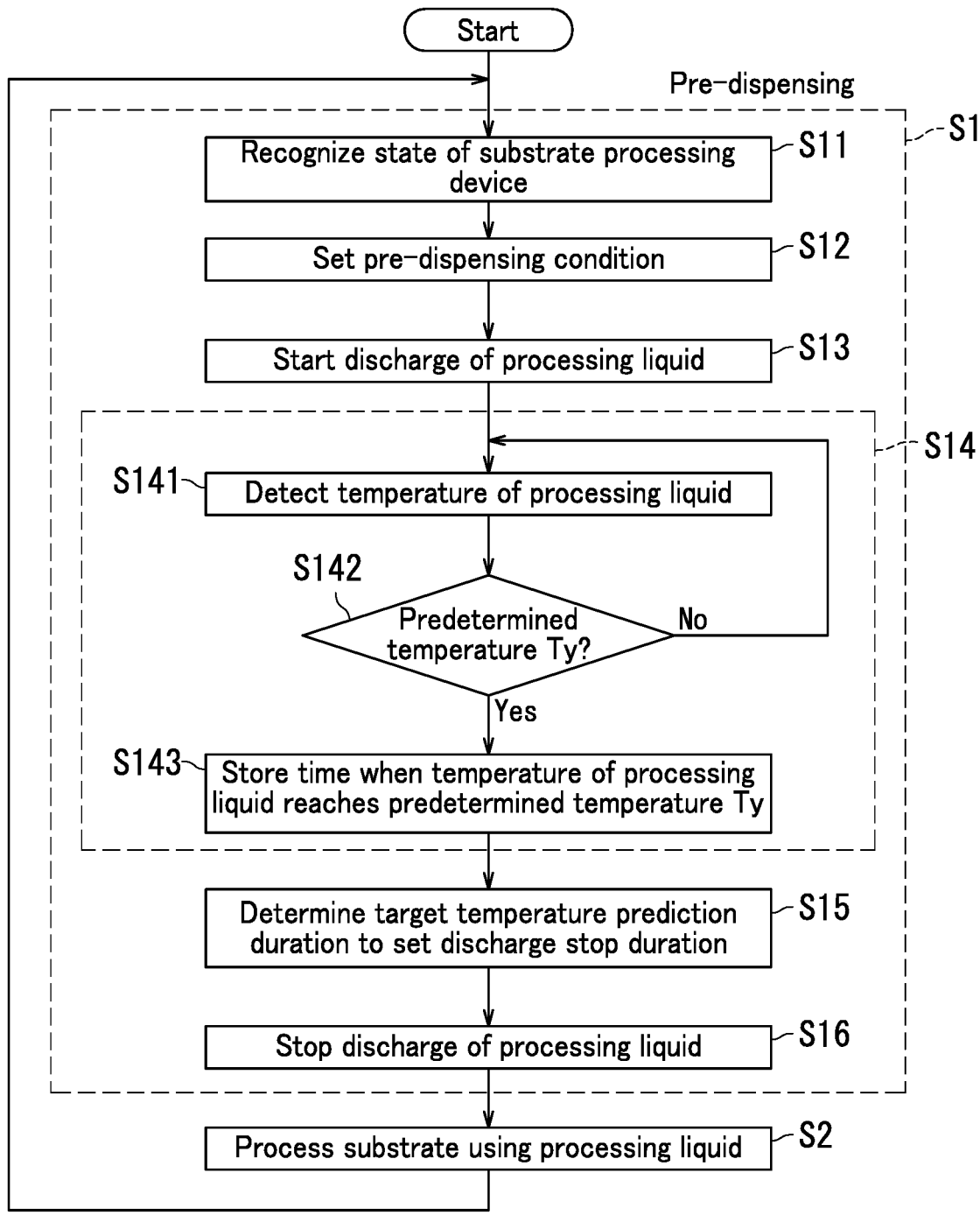
FIG. 5 is a flowchart depicting a substrate processing method implemented by the substrate processing apparatus according to the first embodiment.

A substrate processing method implemented by the substrate processing apparatus 100 will next be described with reference to FIGS. 1, 4, and 5. FIG. 5 is a flowchart depicting the substrate processing method. As depicted in FIG. 5, the substrate processing method includes Step S1 and Step S2. The substrate processing method is implemented by the substrate processing apparatus 100 that processes substrates W using their respective processing liquid.

As illustrated in FIGS. 1 and 5, in Step S1, the substrate processing apparatus 100 performs pre-dispensing according to a pre-dispensing condition. Step S1 corresponds to an example of a step of "performing pre-dispensing". Then, in Step S2, the substrate processing apparatus 100 processes a substrate W using processing liquid. Step S2 corresponds to an example of a step of "substrate processing". The substrate processing apparatus 100 performs Steps S1 and S2 for each of substrates W to be processed one by one.

Specifically, Step S1 includes Step S11 to Step S16.

In Step S11, the controller 30 recognizes a state of the substrate processing apparatus 100 indicated by state information of the substrate processing apparatus 100. The state information is hereinafter referred to as "state information ST". The state information ST of the substrate processing apparatus 100 includes at least one chosen from information indicating an elapsed time from completion of processing of a substrate W processed immediately before and information indicating how many substrates W have been held by the spin chuck 11 in order to be processed one by one. After Step S11, the process proceeds to Step S12.

In Step S12, the controller 30 sets the pre-dispensing condition to the substrate processing apparatus 100. Specifically, the controller 30 sets a pre-dispensing condition selected from mutually different pre-dispensing conditions to the substrate processing apparatus 100. After Step S12, the process proceeds to Step S13.

In Step S13, the controller 30 controls the supply adjustment section 2 according to the pre-dispensing condition so that the nozzle 12 starts discharge of processing liquid toward the liquid receiving section 15. The nozzle 12 consequently starts the discharge of the processing liquid toward the liquid receiving section 15. After Step S13, the process proceeds to Step S14.

In Step 14, before a temperature of the processing liquid in the pre-dispensing in progress reaches the target temperature Tt, the temperature detector 17 detects the temperature of the processing liquid. Specifically, in Step S14, it is detected that the temperature of the processing liquid in the pre-dispensing in progress has reached the predetermined temperature Ty. The predetermined temperature Ty is lower than the target temperature Tt. Step S14 corresponds to an example of a step of "detecting".

More specifically, Step S14 includes Step S141, Step S142, and Step S143.

In Step S141, the temperature detector 17 detects the temperature of the processing liquid from a time before the temperature of the processing liquid in the pre-dispensing in progress reaches the target temperature Tt, and then outputs information indicating the temperature of the processing liquid to the controller 30. Thus, the controller 30 monitors the temperature of the processing liquid from a time before the temperature of the processing liquid reaches the target temperature Tt. After Step S141, the process proceeds to Step S142.

In Step S142, the controller 30 determines whether or not the temperature of the processing liquid has reached the predetermined temperature Ty.

When it is determined that the temperature of the processing liquid has not reached the predetermined temperature Ty (Step S142, No), the process returns to Step S141.

In contrast, when it is determined that the temperature of the processing liquid has reached the predetermined temperature Ty (Step S142, Yes), the process proceeds to Step S143. Note that even after it is determined that the temperature of the processing liquid has reached the predetermined temperature Ty, the temperature detector 17 detects a temperature of the processing liquid and the controller 30 monitors the temperature of the processing liquid.

In Step S143, the controller 30 controls the storage 31 so that the storage 31 stores a time (for example, the time ta) when the temperature of the processing liquid reaches the predetermined temperature Ty. The storage 31 consequently stores the time when the temperature of the processing liquid reaches the predetermined temperature Ty. After Step S143, the process proceeds to Step S15.

In Step S15, the controller 30 sets the discharge stop duration of the processing liquid in the pre-dispensing based on the target temperature prediction duration tP. Specifically, based on the temperature profile PF, the controller 30 determines the target temperature prediction duration tP according to the predetermined temperature Ty. The controller 30 then sets the target temperature prediction duration tP to the discharge stop duration of the processing liquid. The predetermined temperature Ty matches the detection temperature Td. The detection temperature Td is a temperature of the processing liquid detected in Step S14 before the processing liquid reaches the target temperature Tt. Step S15 corresponds to an example of a step of "setting". After Step S15, the process proceeds to Step S16.

In Step S16, at a time (for example, the time tA) when the target temperature prediction duration tP has elapsed since a time (for example, the time ta) when it was detected that the temperature of the processing liquid had reached the predetermined temperature Ty, the controller 30 controls the supply adjustment section 2 so that discharge of the processing liquid in the pre-dispensing is stopped. The nozzle 12 consequently stops the discharge of the processing liquid. The pre-dispensing then ends. Step S16 corresponds to an example of a step of "stopping". After Step S16, the process proceeds to Step S2. When Step S2 is completed, the pre-dispensing and the processing using the processing liquid for one substrate W are completed.

Second Embodiment

A substrate processing apparatus 100 according to a second embodiment of the present invention will be described with reference to FIGS. 1 and 6 to 8. The second embodiment differs from the first embodiment in that the second embodiment determines target temperature prediction duration according to a temperature of a processing liquid detected at a predetermined detection time. Hereinafter, the predetermined detection time may also be referred to as "predetermined detection time ty". Hereinafter, points of the second embodiment different from those of the first embodiment will mainly be described.

Figure 6:
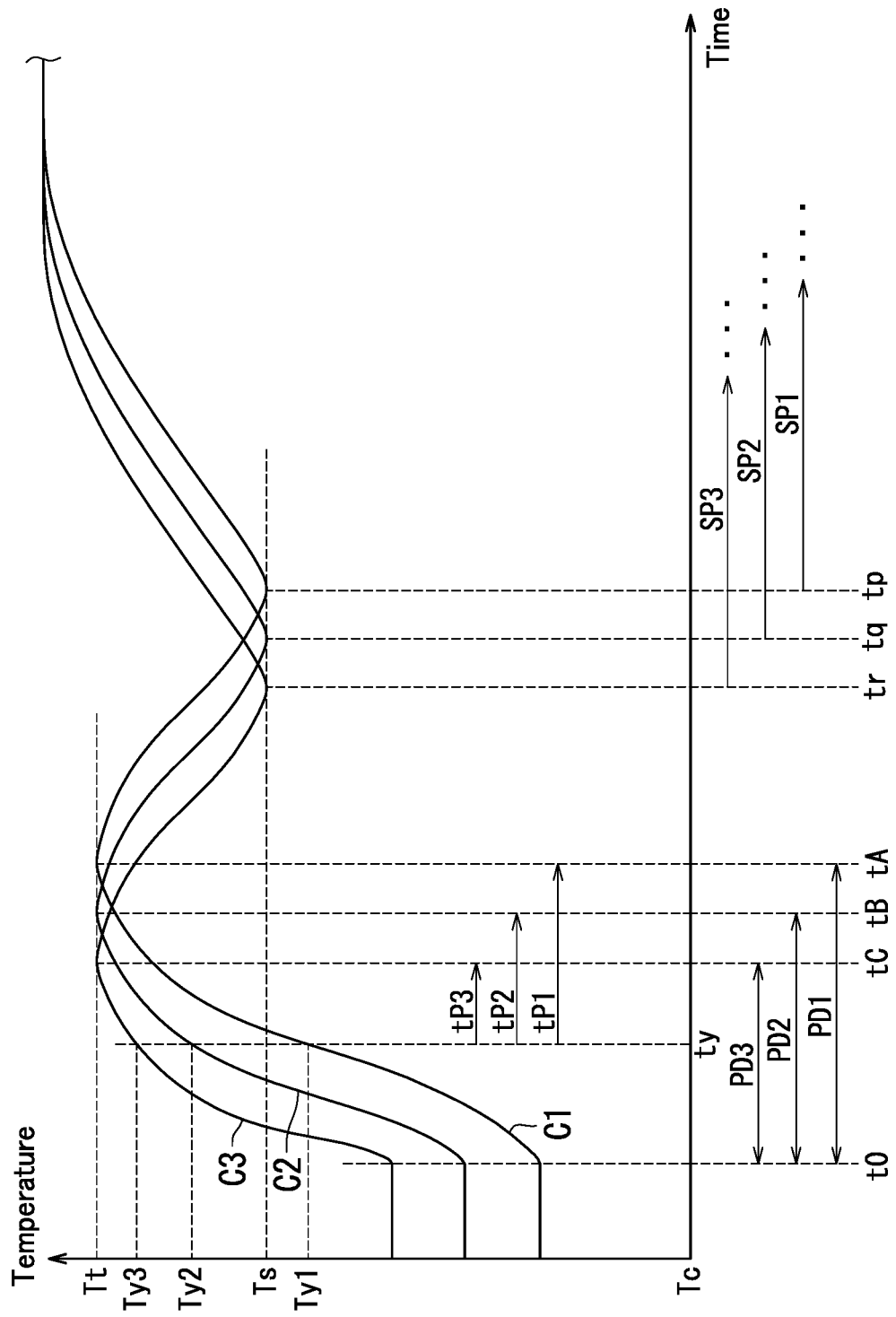
FIG. 6 illustrates changes in temperatures of processing liquid in a substrate processing apparatus according to a second embodiment of the present invention.

Control of discharge of a processing liquid in pre-dispensing in progress will first be described with reference to FIGS. 1, 6, and 7. FIG. 6 depicts changes in temperatures of processing liquid in a processing unit 1. A curve C1 to a curve C3 depicted in FIG. 6 are similar to the curve C1 to the curve C3 depicted in FIG. 4, respectively, and description thereof is omitted as appropriate.

As illustrated in FIGS. 1 and 6, a temperature detector 17 detects a temperature of processing liquid at a predetermined detection time ty in the pre-dispensing in progress for each of substrates W. The temperature of the processing liquid detected at the predetermined detection time ty is a detection temperature Td. The predetermined detection time ty is a time before the temperature of the processing liquid reaches a target temperature Tt, and determined in advance.

As depicted by the curve C1, processing liquid for a first substrate W at the predetermined detection time ty has a temperature Ty1. As depicted by the curve C2, processing liquid for a second substrate W at the predetermined detection time ty has a temperature Ty2. As depicted by the curve C3, processing liquid for a third substrate W at the predetermined detection time ty has a temperature Ty3.

The controller 30 refers to a temperature profile PF to determine target temperature prediction duration tP1 to target temperature prediction duration tP3 for the temperature Ty1 to the temperature Ty3 of the processing liquid at the predetermined detection time ty, respectively. That is, based on the temperature profile PF, the controller 30 determines the target temperature prediction duration tP1 to the target temperature prediction duration tP3 according to the temperature Ty1 to the temperature Ty3 of the processing liquid at the predetermined detection time ty, respectively.

A specific procedure for determining the target temperature prediction duration tP1 to the target temperature prediction duration tP3 will be described with reference to FIGS. 6 and 7. FIG. 7 illustrates the temperature profile PF. The temperature profile PF illustrated in FIG. 7 is similar to the temperature profile PF illustrated in FIG. 3 and description thereof is omitted as appropriate.

Figure 7:
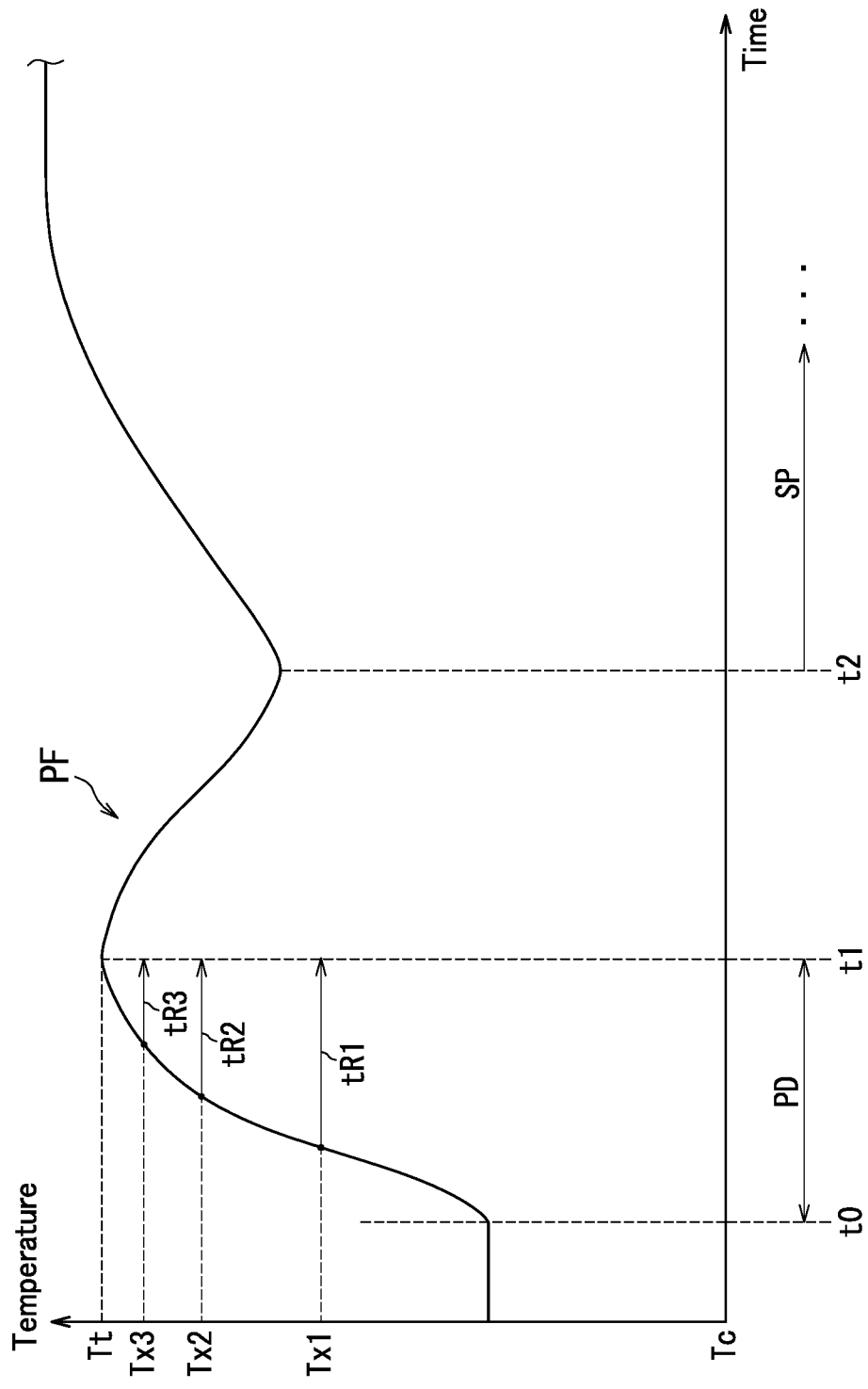
FIG. 7 illustrates a temperature profile of the substrate processing apparatus according to the second embodiment.

As illustrated in FIGS. 6 and 7, the controller 30 refers to the temperature profile PF to specify duration tR1 based on a temperature Tx1 that matches the temperature Ty1 of processing liquid for the first substrate W at the predetermined detection time ty. The duration tR1 is duration until the temperature of the processing liquid reaches the target temperature Tt from the temperature Tx1. It can therefore be predicted that when the temperature Ty1 of the processing liquid in pre-dispensing in progress substantially matches the temperature Tx1 in the temperature profile PF, the temperature of the processing liquid in the pre-dispensing in progress will reach the target temperature Tt from the temperature Ty1 when the duration tR1 in the temperature profile PF has elapsed since the predetermined detection time ty. The controller 30 therefore sets the duration tR1 specified from the temperature profile PF to target temperature prediction duration tP1 in the pre-dispensing in progress with respect to the temperature Ty1 of the processing liquid at the predetermined detection time ty.

Similarly, the controller 30 refers to the temperature profile PF to specify duration tR2 based on a temperature Tx2 that matches the temperature Ty2 of processing liquid for the second substrate W at the predetermined detection time ty. The duration tR2 is duration until the temperature of the processing liquid reaches the target temperature Tt from the temperature Tx2. The controller 30 then sets the duration tR2 to target temperature prediction duration tP2 with respect to the temperature Ty2 of the processing liquid.

Similarly, the controller 30 refers to the temperature profile PF to specify duration tR3 based on a temperature Tx3 that matches the temperature Ty3 of processing liquid for the third substrate W at the predetermined detection time ty. The duration tR3 is duration until the temperature of the processing liquid reaches the target temperature Tt from the temperature Tx3. The controller 30 then sets the duration tR3 to target temperature prediction duration tP3 with respect to the temperature Ty3 of the processing liquid.

As described above with reference to FIGS. 6 and 7, the controller 30 determines the target temperature prediction duration tP1 to the target temperature prediction duration tP3 based on the temperature profile PF. As illustrated in FIG. 6, the controller 30 then controls a supply adjustment section 2 (specifically a valve 20) so that, for the first substrate W to the third substrate W, discharge of their respective processing liquid in the pre-dispensing is stopped when the target temperature prediction duration tP1 to the target temperature prediction duration tP3 have elapsed since the predetermined detection time ty, respectively.

Specifically, as illustrated in the curve C1, a nozzle 12 stops the discharge of the processing liquid for the first substrate W at a time to when the target temperature prediction duration tP1 has elapsed since the predetermined detection time ty. As depicted by the curve C2, the nozzle 12 stops the discharge of the processing liquid for the second substrate W at a time tB when the target temperature prediction duration tP2 has elapsed since the predetermined detection time ty. As depicted by the curve C3, the nozzle 12 stops the discharge of the processing liquid for the third substrate W at a time tC when the target temperature prediction duration tP3 has elapsed since the predetermined detection time ty.

Thus, in the second embodiment, temperatures of the processing liquid for the three substrates W at the end time tA to the end time tC in the pre-dispensing are substantially the same as the target temperature Tt. That is, it is possible to inhibit the temperatures of the processing liquid at the end time tA to the end time tC in the pre-dispensing from differing across the three substrates W. It is therefore possible to inhibit respective processing start temperatures of the three substrates W from differing across the substrates W. Specifically, the respective processing start temperatures of the first to third substrates W match a temperature Ts and substantially the same as one another. It is consequently possible to improve uniformity of results of processing using the processing liquid among the three substrates W. That is, it is possible to improve uniformity of results of processing using the processing liquid among substrates W. Besides, the second embodiment has the same effects as those of the first embodiment.

Figure 8:
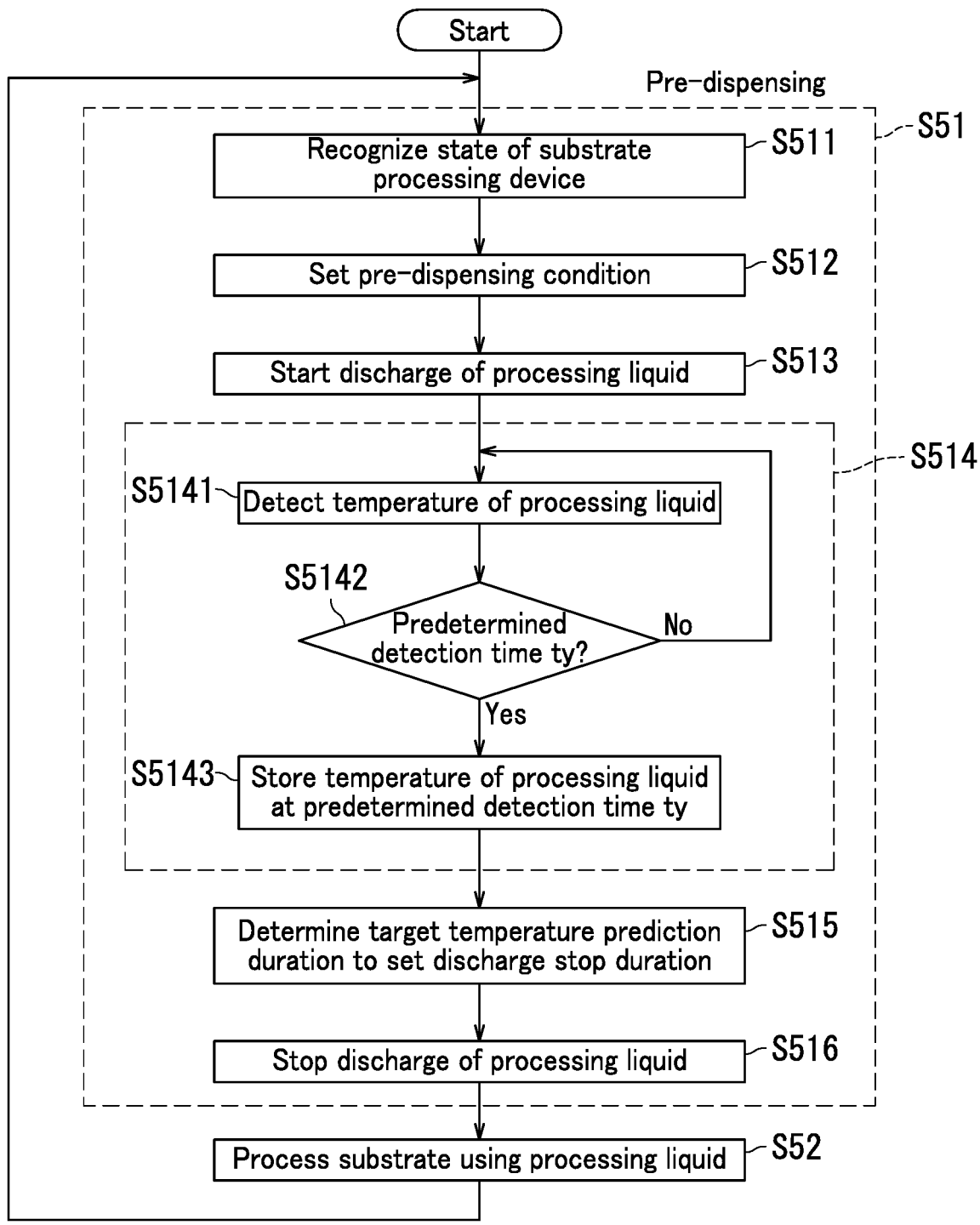
FIG. 8 is a flowchart depicting a substrate processing method implemented by the substrate processing apparatus according to the second embodiment.

A substrate processing method implemented by the substrate processing apparatus 100 will next be described with reference to FIGS. 1, 6, and 8. FIG. 8 is a flowchart depicting the substrate processing method. As illustrated in FIG. 8, the substrate processing method includes Step S51 and Step S52. The substrate processing method is implemented by the substrate processing apparatus 100 that processes substrates W using their respective processing liquid.

As illustrated in FIGS. 1 and 8, in Step S51, the substrate processing apparatus 100 performs pre-dispensing according to a pre-dispensing condition. Step S51 corresponds to an example of a step of "performing pre-dispensing". Then, in Step S52, the substrate processing apparatus 100 processes a substrate W using processing liquid. Step S52 corresponds to an example of a step of "substrate processing". The substrate processing apparatus 100 performs Step S51 and Step S52 for each of the substrates W to be processed one by one.

Specifically, Step S51 includes Step S511 to Step S516.

In Step S511, the controller 30 recognizes a state of the substrate processing apparatus 100 indicated by state information ST of the substrate processing apparatus 100. After Step S511, the process proceeds to Step S512.

In Step S512, the controller 30 sets a pre-dispensing condition to the substrate processing apparatus 100. After Step S512, the process proceeds to Step S513.

In Step S513, the controller 30 controls the supply adjustment section 2 according to the pre-dispensing condition so that the nozzle 12 starts discharge of processing liquid toward a liquid receiving section 15. The nozzle 12 consequently starts the discharge of the processing liquid toward the liquid receiving section 15. After Step S513, the process proceeds to Step S514.

Note that Step S511 to Step S513 are similar to Step S11 to Step S13 depicted in FIG. 5, respectively.

In Step 514, the temperature detector 17 detects a temperature of processing liquid in the pre-dispensing in progress before the temperature of the processing liquid reaches the target temperature Tt. Specifically, in Step S514, the temperature of the processing liquid is detected at the predetermined detection time ty in the pre-dispensing in progress. The predetermined detection time ty is a time before the temperature of the processing liquid reaches the target temperature Tt. Step S514 corresponds to an example of a step of "detecting".

More specifically, Step S514 includes Steps S5141, Step S5142, and Step S5143.

In Step S541, the temperature detector 17 detects the temperature of the processing liquid from a time before the temperature of the processing liquid in the pre-dispensing in progress reaches the target temperature Tt, and then outputs information indicating the temperature of the processing liquid to the controller 30. Thus, the controller 30 monitors the temperature of the processing liquid from a time before the temperature of the processing liquid reaches the target temperature Tt. After Step S5141, the process proceeds to Step S5142.

In Step S5142, the controller 30 determines whether or not time has reached the predetermined detection time ty.

When it is determined that time has not reached the predetermined detection time ty (Step S5142, No), the process returns to Step S5141.

In contrast, when it is determined that time has reached the predetermined detection time ty (Step S5142, Yes), the process proceeds to Step S5143. Note that even after it is determined that time has reached the predetermined detection time ty, the temperature detector 17 keeps detecting the temperature of the processing liquid and the controller 30 keeps monitoring the temperature of the processing liquid.

In Step S5143, the controller 30 controls storage 31 so that the storage 31 stores the temperature (for example, the temperature Ty1) of the processing liquid detected at the predetermined detection time ty. The storage 31 consequently stores the temperature of the processing liquid at the predetermined detection time ty. After Step S5143, the process proceeds to Step S515.

In Step S515, the controller 30 sets discharge stop duration of the processing liquid in the pre-dispensing based on the target temperature prediction duration tP. Specifically, based on the temperature profile PF, the controller 30 determines target temperature prediction duration (for example, the target temperature prediction duration tP1) according to a temperature (for example, the temperature Ty1) detected at the predetermined detection time ty. The controller 30 then sets the target temperature prediction duration to the discharge stop duration of the processing liquid. The temperature of the processing liquid detected at the predetermined detection time ty is the detection temperature Td. The detection temperature Td is a temperature of the processing liquid detected in Step S514 before the temperature of the processing liquid reaches the target temperature Tt. Step S515 corresponds to an example of a step of "setting". After Step S515, the process proceeds to Step S516.

In Step S516, the supply adjustment section 2 is controlled so that discharge of the processing liquid in the pre-dispensing is stopped at a time (for example, the time tA) when the target temperature prediction duration has elapsed since the predetermined detection time ty. The nozzle 12 consequently stops the discharge of the processing liquid. The pre-dispensing then ends. Step S516 corresponds to an example of a step of "stopping discharge in the pre-dispensing". After Step S516, the process proceeds to Step S52. When Step S52 is completed, the pre-dispensing and the processing using the processing liquid for one substrate W are completed.

Third Embodiment

A substrate processing apparatus 100 according to a third embodiment of the present invention will be described with reference to FIGS. 1 and 9. The third embodiment differs from the first embodiment in that the third embodiment has respective temperature profiles PF corresponding to pre-dispensing conditions. Hereinafter, points of the third embodiment different from those of the first embodiment will mainly be described.

Figure 9:
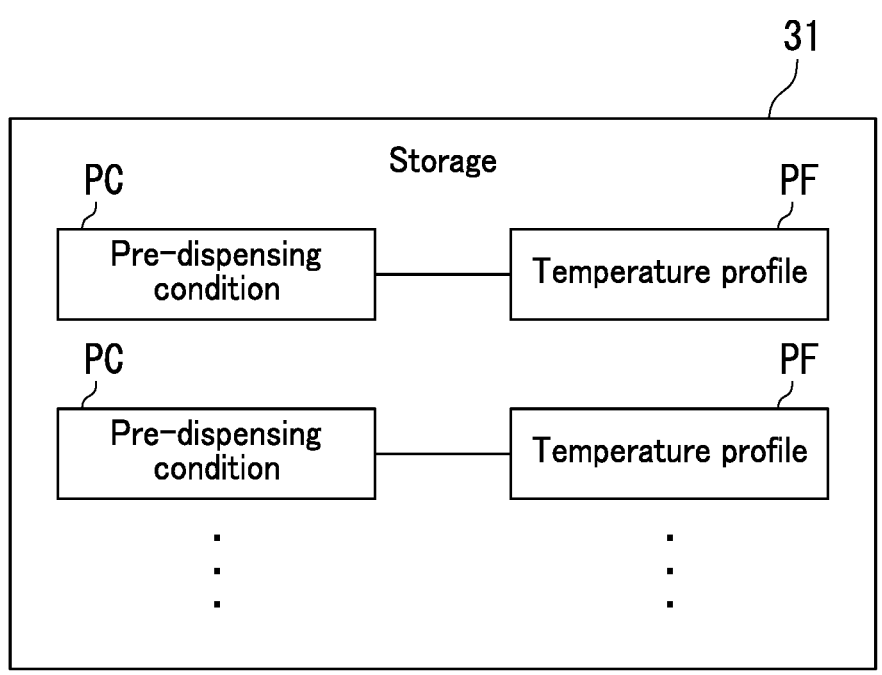
FIG. 9 is a conceptual diagram depicting pre-dispensing conditions and temperature profiles stored in storage of a substrate processing apparatus according to a third embodiment of the present invention.

FIG. 9 is a conceptual diagram depicting the pre-dispensing conditions PC and the temperature profiles PF stored in storage 31 of the substrate processing apparatus 100 according to the third embodiment. As illustrated in FIG. 9, the storage 31 stores mutually different pre-dispensing conditions PC. The storage 31 further stores mutually different temperature profiles PF that are associated with the pre-dispensing conditions PC, respectively.

As illustrated in FIGS. 1 and 9, a controller 30 selects one pre-dispensing condition PC from the pre-dispensing conditions PC. The one pre-dispensing condition PC is hereinafter referred to as a "pre-dispensing condition PCA". The controller 30 then controls a supply adjustment section 2 and a nozzle moving unit 14 according to the pre-dispensing condition PCA selected from the pre-dispensing conditions PC to perform pre-dispensing corresponding thereto.

The controller 30 then specifies, from the temperature profiles PF, a temperature profile associated with the pre-dispensing condition PCA. The temperature profile specified is hereinafter referred to as a "temperature profile PFA". The pre-dispensing condition when temperature changing over time in the temperature profile PFA is recorded is the same as the pre-dispensing condition PCA associated with the temperature profile PFA. That is, the pre-dispensing condition when the temperature changing over time in the temperature profile PFA is recorded is the same as the selected pre-dispensing condition PCA.

It is therefore possible to determine target temperature prediction duration based on the temperature profile PFA more suitable for pre-dispensing in progress. It is consequently possible to more precisely determine the target temperature prediction duration. The controller 30 then sets discharge end duration of the processing liquid in the pre-dispensing based on more precise target temperature prediction duration. It is therefore possible to further inhibit temperatures of processing liquid at end times in the pre-dispensing from differing across substrates W. It is consequently possible to further improve uniformity of results of processing using the processing liquid among the substrates W. Besides, the third embodiment has the same effects as those of the first embodiment.

For example, attention is focused on a pre-dispensing condition PC and another pre-dispensing condition PC. The former is hereinafter referred to as a "pre-dispensing condition PC1" and the latter is hereinafter referred to as a "pre-dispensing condition PC2". The pre-dispensing condition PC1 indicates a flow amount of P (liter/minute). The pre-dispensing condition PC2 indicates a flow amount of Q (liter/minute). The flow amount of P is different from the flow amount of Q. A temperature profile PF corresponding to the flow amount of P is different from a temperature profile PF corresponding to the flow amount of Q. As a result, in the case where a pre-dispensing condition corresponding to pre-dispensing in progress is the pre-dispensing condition PC1 for example, precision of target temperature prediction duration based on the temperature profile PF corresponding to the flow amount of P is higher than precision of target temperature prediction duration based on the temperature profile PF corresponding to the flow amount of Q.

Fourth Embodiment

A substrate processing apparatus 100 according to a fourth embodiment of the present invention will be described with reference to FIGS. 1 and 10. The fourth embodiment differs from the first embodiment in that the fourth embodiment has temperature profiles PF corresponding to pieces of state information ST, respectively. Hereinafter, points of the fourth embodiment different from those of the first embodiment will mainly be described.

Figure 10:
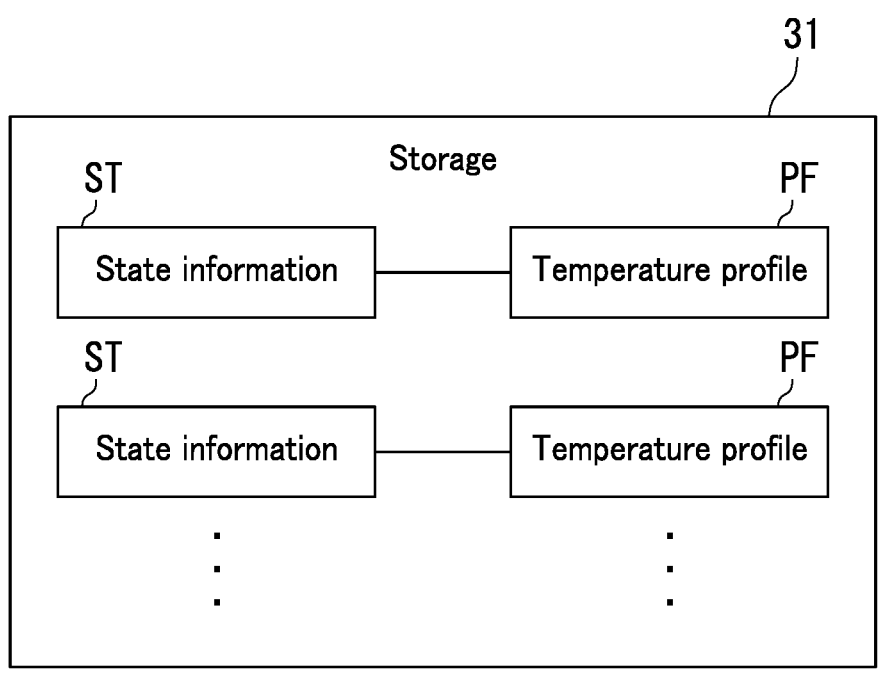
FIG. 10 is a conceptual diagram depicting temperature profiles and pieces of status information on a substrate processing apparatus according to a fourth embodiment of the present invention, which are stored in storage of the substrate processing device.

FIG. 10 is a conceptual diagram depicting the temperature profiles PF and the pieces of state information ST on the substrate processing apparatus 100 according to the fourth embodiment, which are stored in storage 31 of the substrate processing apparatus 100. As illustrated in FIG. 10, the storage 31 stores the pieces of state information ST that are different from each other. The storage 31 further stores mutually different temperature profiles PF that are associated with the pieces of state information ST, respectively. Each piece of state information ST on the substrate processing apparatus 100 includes at least one chosen from information indicating an elapsed time from completion of processing of a substrate W processed immediately before and information indicating how many substrates W have been held by a spin chuck 11 in order to be processed one by one.

For example, a piece of state information ST indicates that the elapsed time from the completion of processing of a substrate W processed immediately before is three hours, and another piece of state information ST indicates that the elapsed time from the completion of processing of a substrate W processed immediately before is ten minutes. For example, a piece of state information ST indicates that a first substrate W is held by the spin chuck 11, and another piece of state information ST indicates that a third substrate W is held by the spin chuck 11.

As illustrated in FIGS. 1 and 10, a controller 30 specifies, from the pieces of state information ST, a piece of state information ST indicating a current state of a substrate processing apparatus 100. The piece of state information ST is hereinafter referred to as "state information STA".

The controller 30 then specifies, from the temperature profiles PF, a temperature profile PF associated with the state information STA. The temperature profile PF is hereinafter referred to as a "temperature profile PFA". When the state of the substrate processing apparatus 100 is a state indicated by the state information STA, the temperature profile PFA indicates a record of temperature changing over time of processing liquid when pre-dispensing processing was performed in the past according to the pre-dispensing condition.

Thus, in the fourth embodiment, it is possible to determine target temperature prediction duration based on the temperature profile PFA further suitable to the state of the substrate processing apparatus 100 in the pre-dispensing in progress. It is consequently possible to further precisely determine the target temperature prediction duration. The controller 30 then sets discharge end duration of processing liquid in pre-dispensing based on the further precise target temperature prediction duration. It is therefore possible to further inhibit temperatures of processing liquid at end times of the pre-dispensing from differing across substrates W. It is consequently possible to further improve uniformity of results of processing using the processing liquid among the substrates W. Besides the fourth embodiment has effects similar to those of the first embodiment.

For example, attention is focused on a piece of state information and another piece of state information. The former is hereinafter referred to as "state information ST1". The latter is hereinafter referred to as "state information ST2". The state information ST1 indicates that an elapsed time from completion of processing of a substrate W processed immediately before is three hours. The state information ST2 indicates that an elapsed time from completion of processing of a substrate W processed immediately before is ten minutes. A temperature profile PF corresponding to the state information ST1 is therefore different from a temperature profile PF corresponding to the state information ST2. As a result, in the case where a state of the substrate processing apparatus 100 in pre-dispensing in progress is indicated by the state information ST1 for example, precision of target temperature prediction duration based on the temperature profile PF corresponding to the state information ST1 is higher than precision of target temperature prediction duration based on the temperature profile PF corresponding to the state information ST2.

Fifth Embodiment

Figure 11:
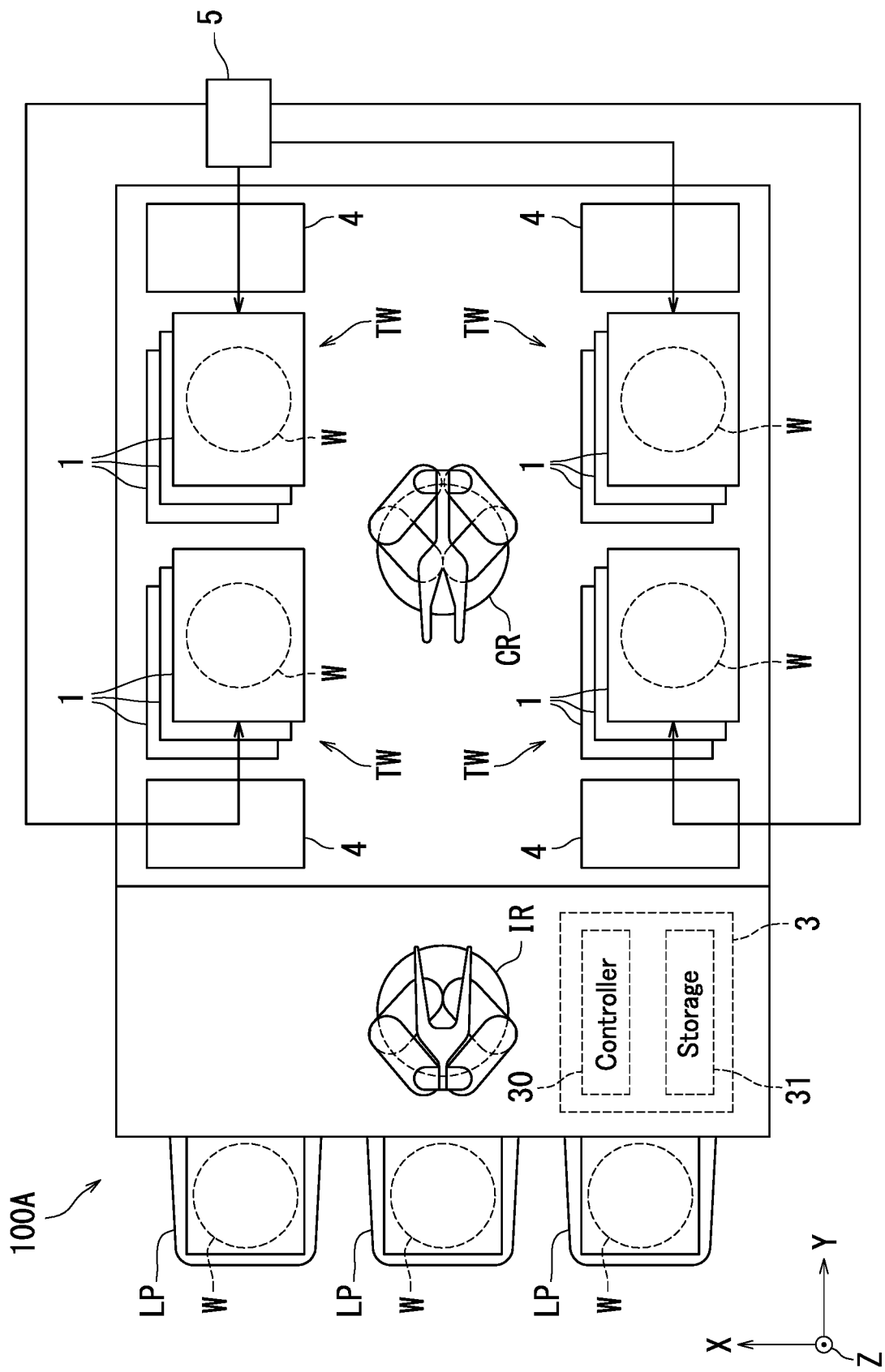
FIG. 11 is a plan view of a substrate processing apparatus according to a fifth embodiment of the present invention.
Figure 12:
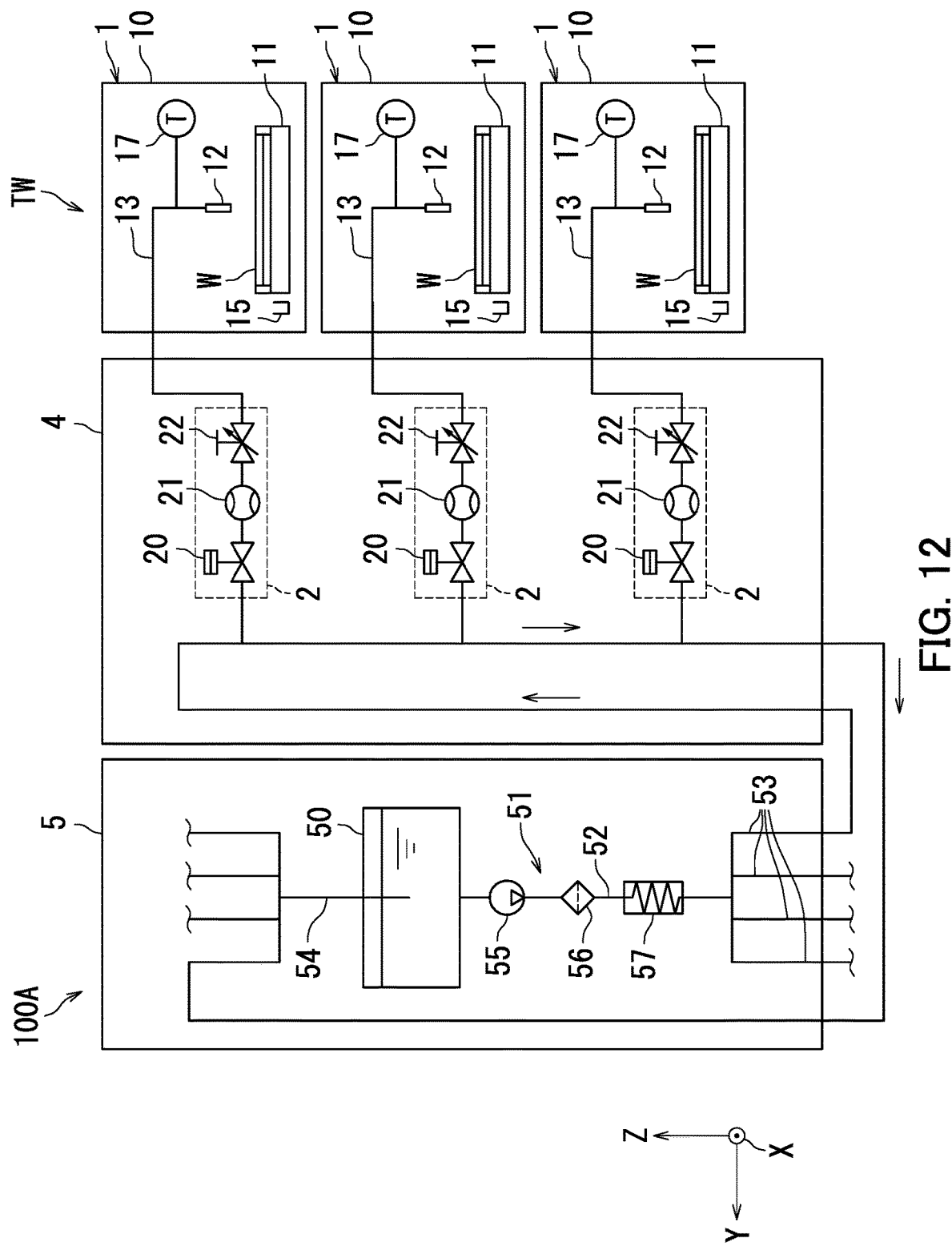
FIG. 12 illustrates piping of the substrate processing apparatus according to the fifth embodiment.
Figure 13:
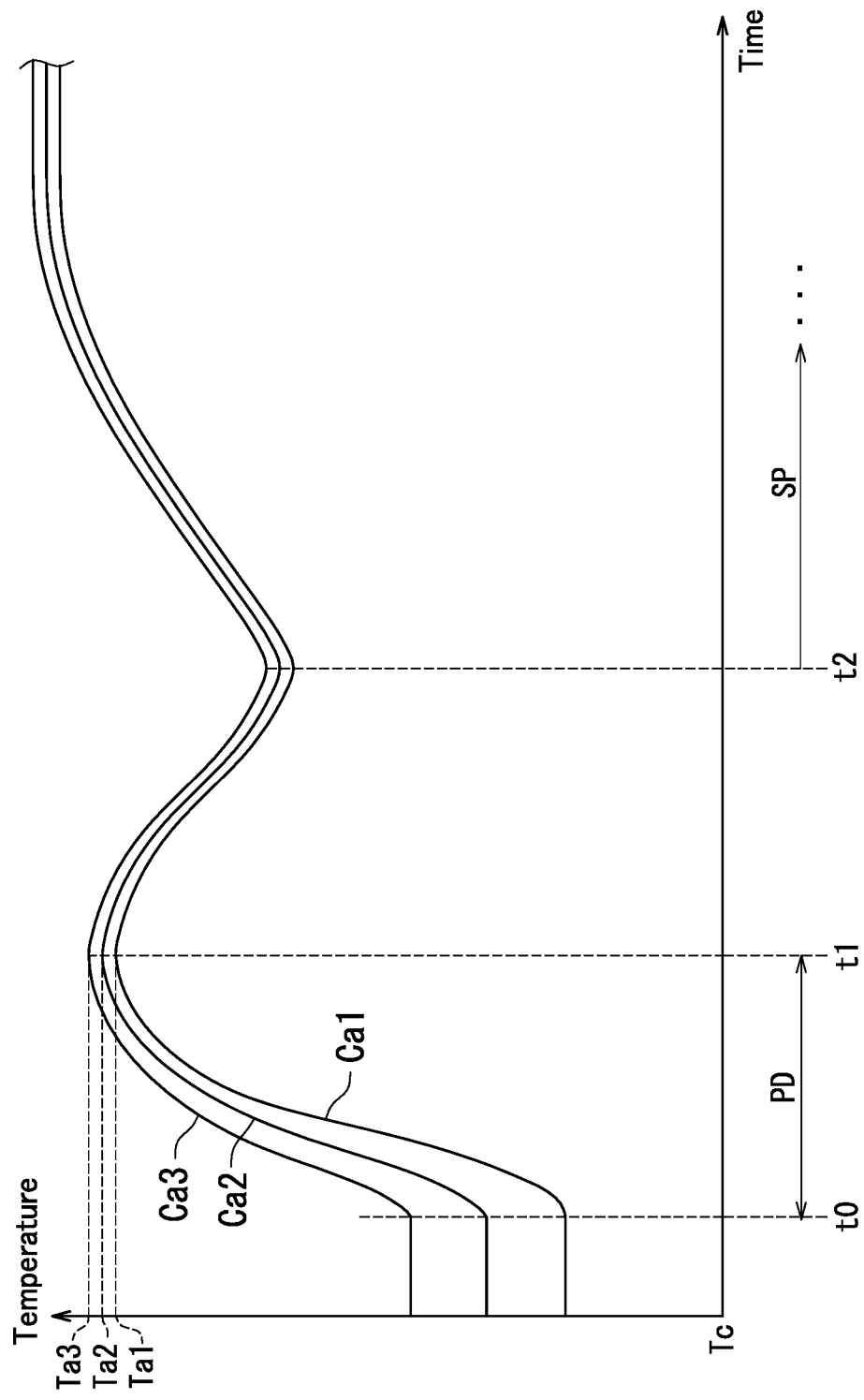
FIG. 13 illustrates changes in temperatures of processing liquid in a general substrate processing device.

A substrate processing apparatus 100A according to a fifth embodiment of the present invention will be described with reference to FIGS. 11 and 12. The fifth embodiment differs from the first embodiment in that the fifth embodiment includes processing units 1. Hereinafter, points of the fifth embodiment different from those of the first embodiment will mainly be described.

The substrate processing apparatus 100A will first be described with reference to FIG. 11. FIG. 11 is a plan view of the substrate processing apparatus 100A. As illustrated in FIG. 11, the substrate processing apparatus 100A includes load ports LP, an indexer robot IR, a center robot CR, the processing units 1, fluid boxes 4, a processing liquid cabinet 5, and a control device 3. The control device 3 controls the load ports LP, the indexer robot IR, the center robot CR, and the processing units 1. The control device 3 includes a controller 30 and storage 31.

Each of the load ports LP contains substrates W with the substrates W stacked. The indexer robot IR conveys a substrate W between a load port LP and the center robot CR. The center robot CR conveys the substrate W between the indexer robot IR and a processing unit 1. Each of the processing units 1 discharges processing liquid onto a substrate W to process the substrate W. Each of the fluid boxes 4 contains fluid equipment. The processing liquid cabinet 5 contains processing liquid.

Specifically, the processing units 1 form towers TW that are arranged to surround the center robot CR in plan view. In the fifth embodiment, the towers TW are four towers. Each of the towers TW includes processing units 1 (in the fifth embodiment, three processing units 1) stacked vertically. The fluid boxes 4 correspond to the towers TW individually. The processing liquid in the processing liquid cabinet 5 is supplied, through a fluid box 4 of the fluid boxes 4, all the processing units 1 included in a tower TW corresponding to the fluid box 4.

The controller 30 operates in the same way as the controller 30 in the first embodiment described with reference to FIGS. 1 to 5. That is, the controller 30 sets discharge stop duration of processing liquid in pre-dispensing based on target temperature prediction duration. In the fifth embodiment, it is therefore possible to improve uniformity of results of processing using processing liquid among substrates W to be processed one by one in one chamber 10 like the first embodiment.

The substrate processing apparatus 100A in the fifth embodiment also includes a spin chuck 11, a nozzle 12, a supply adjustment section 2, a liquid receiving section 15, and a temperature detector 17 for each chamber 10. Each of the chambers 10 contains a spin chuck 11, a nozzle 12, a supply adjustment section 2, a liquid receiving section 15, and a temperature detector 17.

The controller 30 sets discharge stop duration of the processing liquid in the pre-dispensing based on target temperature prediction duration for each chamber 10. It is therefore possible to inhibit temperatures of processing liquid at end times in the pre-dispensing from differing among substrates W across chambers 10. It is consequently possible to improve uniformity of results of processing using the processing liquid among the substrates W to be processed in the chambers 10. It is for example possible to improve uniformity of results of processing using the processing liquid among the substrates W across chambers 10 of one tower TW. It is for example possible to improve uniformity of results of processing using the processing liquid among the substrates W across the towers TW. Note that the substrate processing apparatus 100A performs the substrate processing method depicted in FIG. 5 for each chamber 10. That is, Step S1 and Step S2 are performed for each of the chambers 10. The chambers 10 contain substrates W individually.

Supply of processing liquid to a nozzle 12 will next be described with reference to FIG. 12. FIG. 12 illustrates piping of the substrate processing apparatus 100A. As illustrated in FIG. 12, the substrate processing apparatus 100A includes a supply pipe 13 and a supply adjustment section 2 for each of processing units 1 in each tower TW. Each adjustment section 2 is contained in a fluid box 4 of a corresponding tower TW. Part of each supply pipe 13 is contained in a corresponding chamber 10, and another part of each supply pipe 13 is contained in a corresponding fluid box 4.

The substrate processing apparatus 100A further includes a processing liquid tank 50, a circulation pipe 51, a pump 55, a filter 56, and a temperature controller 57. The processing liquid cabinet 5 contains the processing liquid tank 50, the pump 55, the filter 56, and the temperature controller 57. Part of the circulation pipe 51 is contained in the processing liquid cabinet 5, and other part of the circulation pipe 51 is contained in each fluid box 4.

The circulation pipe 51 includes an upstream pipe 52 extending downstream from the processing liquid tank 50, individual pipes 53 branched from the upstream pipe 52, and a downstream pipe 54 extending downstream from each individual pipe 53 to the processing liquid tank 50.

An upstream end of the upstream pipe 52 is connected to the processing liquid tank 50. A downstream end of the downstream pipe 54 is connected to the processing liquid tank 50. The upstream end of the upstream pipe 52 corresponds to an upstream end of the circulation pipe 51. The downstream end of the downstream pipe 54 corresponds to a downstream end of the circulation pipe 51. The individual pipes 53 extend from the downstream end of the upstream pipe 52 to the upstream end of the downstream pipe 54.

The individual pipes 53 correspond to the towers TW individually. Three supply pipes 13 corresponding to three processing units 1 included in one tower TW are connected to one individual pipe 53.

The pump 55 forces processing liquid inside the processing liquid tank 50 into the circulation pipe 51. The filter 56 removes foreign bodies from the processing liquid flowing through the circulation pipe 51. The temperature controller 57 adjusts the temperature of the processing liquid inside the processing liquid tank 50. The temperature controller 57 is for example, a heater that applies heat to the processing liquid.

The pump 55, the filter 56, and the temperature controller 57 are arranged along the upstream pipe 52. The processing liquid inside the processing liquid tank 50 is forced into the upstream pipe 52 by the pump 55, thereby flowing into the individual pipes 53 from the upstream pipe 52. The processing liquid inside the individual pipes 53 flows into the downstream pipe 54, thereby returning to the processing liquid tank 50 from the downstream pipe 54. The processing liquid inside the processing liquid tank 50 is heated to a specific temperature equal to or higher than a prescribed temperature TM to be forced into the upstream pipe 52. The temperature of the processing liquid circulating in the circulation pipe 51 is kept at the specific temperature equal to or higher than the prescribed temperature TM. The processing liquid kept at the specific temperature inside the circulation pipe 51 is then supplied to the supply pipes 13.

Embodiments of the present invention have been described above with reference to the accompanying drawings. However, the present invention is not limited to the above embodiments and may be implemented in various manners within a scope not departing from the gist thereof (for example, (1) to (3) below). Furthermore, various inventions may be created by appropriately combining constituent elements disclosed in the above embodiments. For example, some constituent elements may be removed from all of constituent elements disclosed in the embodiments. Furthermore, constituent elements across the three different embodiments may be appropriately combined. The drawings mainly illustrate schematic constituent elements in order to facilitate understanding of the invention, and thickness, length, numbers, intervals or the like of the constituent elements illustrated in the drawings may differ from actual ones thereof in order to facilitate preparation of the drawings. Further, the material, shape, dimensions, and the like of each constituent element described in the above embodiments are merely examples that do not impose any particular limitations and may be altered in various ways as long as such alterations do not substantially deviate from the effects of the present invention.

(1) In the first embodiment to the fifth embodiment, target temperature prediction duration is determined with reference to a temperature profile PF. In this case, the temperature profile PF may be represented in a table or provided as a function. In addition, the derivation form of the target temperature prediction duration is not particularly limited as long as the target temperature prediction duration can be determined based on the temperature profile PF. For example, in the first embodiment, the storage 31 may store the predetermined temperature Ty and the target temperature prediction duration tP, which are associated with each other (FIG. 4). The target temperature prediction duration tP is derived from the temperature profile PF in advance. The controller 30 then acquires the target temperature prediction duration tP from the storage 31. In this case, the controller 30 can obtain the target temperature prediction duration tP even before detection of the detection temperature Td.

For example, in the second embodiment, the storage 31 may store a table in which the temperature Ty1 to the temperature Ty3 at the predetermined detection time ty are associated with the target temperature prediction duration tP1 to the target temperature prediction duration tP3, respectively (FIG. 6). The controller 30 then acquires target temperature prediction duration from the table. For example, a function may indicate a relationship between the temperature Ty1 to the temperature Ty3 at the predetermined detection time ty and the target temperature prediction duration tP1 to the target temperature prediction duration tP3. The controller 30 then derives target temperature prediction duration from the function.

(2) The storage 31 in the second embodiment may store the temperature profiles PF and the pre-dispensing conditions PC in the third embodiment (FIG. 9). Alternatively, the storage 31 in the second embodiment may store the temperature profiles PF and the pieces of state information ST in the fourth embodiment (FIG. 10). Furthermore, the controller 30 of the substrate processing apparatus 100A according to the fifth embodiment may operate in the same way as the controller 30 in the second embodiment. The storage 31 of the substrate processing apparatus 100A may store information similar to information stored in storage 31 in the third embodiment or the fourth embodiment.

(3) In the first embodiment to the fifth embodiment, the temperature detector 17 can detect the temperature of processing liquid at any time even before the temperature of the processing liquid reaches the target temperature Tt. The controller 30 can determine target temperature prediction duration based on the temperature profile PF for each set of detection time and detection temperature of the processing liquid.

INDUSTRIAL APPLICABILITY

The present invention relates to a substrate processing apparatus and a substrate processing method, and has industrial applicability.

REFERENCE SIGNS LIST

1 Processing unit
2 Supply adjustment section
3 Control device
10 Chamber
11 Spin chuck (Substrate holding section)
12 Nozzle
15 Liquid receiving section
17 Temperature detector
30 Controller
31 Storage
100, 100A Substrate processing apparatus
W Substrate

The invention claimed is:

1. A substrate processing apparatus that processes a substrate using processing liquid, the substrate processing apparatus comprising:
   a spin chuck that holds and rotates the substrate;
   a nozzle that discharges the processing liquid;
   a flow control valve that adjusts a supply amount of the processing liquid to the nozzle;
   a pod that is placed outside the spin chuck and that receives the processing liquid discharged from the nozzle;
   a temperature sensor that detects a temperature of the processing liquid;
   a storage; and
   a processor, wherein
   the storage stores:
      a computer program;
      a pre-dispensing condition that allows a performance of pre-dispensing for discharging the processing liquid toward the pod before discharging the processing liquid onto the substrate; and
      a temperature profile that indicates a record of the temperature of the processing liquid changing over time when the pre-dispensing was performed in past according to the pre-dispensing condition, the processor runs the computer program to:
control the flow control valve to allow the nozzle to perform the pre-dispensing;
determine, based on the temperature profile, target temperature prediction duration that is prediction duration until the temperature of the processing liquid reaches a target temperature from a detection temperature detected by the temperature sensor before the temperature of the processing liquid reaches the target temperature; and
set discharge stop duration of the processing liquid in the pre-dispensing based on the target temperature prediction duration.

2. The substrate processing apparatus according to claim 1, wherein
the processor runs the computer program to determine the target temperature prediction duration according to the detection temperature of the processing liquid based on the temperature profile.

3. The substrate processing apparatus according to claim 1, wherein
the temperature sensor detects that the temperature of the processing liquid has reached a predetermined temperature in the pre-dispensing in progress,
the predetermined temperature is lower than the target temperature, and
when the target temperature prediction duration has elapsed since a time when it was detected that the temperature of the processing liquid had reached the predetermined temperature, the processor runs the computer program to control the flow control valve so that discharge of the processing liquid in the pre-dispensing is stopped.

4. The substrate processing apparatus according to claim 1, wherein
the temperature sensor is set so that the temperature sensor detects the temperature of the processing liquid at a predetermined detection time in the pre-dispensing in progress,
the predetermined detection time is a time before the temperature of the processing liquid reaches the target temperature, and
when the target temperature prediction duration has elapsed since the predetermined detection time, the processor runs the computer program to control the flow control valve so that discharge of the processing liquid in the pre-dispensing is stopped.

5. The substrate processing apparatus according to claim 1, wherein
the processor runs the computer program to control the flow control valve according to the pre-dispensing condition selected from pre-dispensing conditions to allow the nozzle to perform the pre-dispensing, and
a pre-dispensing condition when temperature changing over time in the temperature profile is recorded is the same as the pre-dispensing condition selected.

6. The substrate processing apparatus according to claim 1, wherein
in a case where a state of the substrate processing apparatus is a state indicated by state information, the temperature profile indicates the record of the temperature of the processing liquid changing over time when the pre-dispensing was performed in past according to the pre-dispensing condition, and the state information includes at least one chosen from information indicating an elapsed time from completion of processing of a substrate processed immediately before and information indicating how many substrates have been held by the spin chuck in order to be processed one by one.

7. The substrate processing apparatus according to claim 1, wherein
the processing liquid contains phosphoric acid or a mixture of sulfuric acid and hydrogen peroxide.

8. The substrate processing apparatus according to claim 1, further comprising
chambers, wherein
the spin chuck, the nozzle, the flow control valve, the pod, and the temperature sensor are provided for each of the chambers,
the spin chuck, the nozzle, the flow control valve, the pod, and the temperature sensor are contained in each of the chambers, and
the processor runs the compute program to set the discharge stop duration of the processing liquid in the pre-dispensing based on the target temperature prediction duration for each of the chambers.

9. A substrate processing method that is implemented by the substrate processing apparatus of claim 1 that processes the substrate using the processing liquid, the substrate processing method comprising
performing the pre-dispensing according to the pre-dispensing condition, wherein
the pre-dispensing is discharging the processing liquid toward the pod before the processing liquid is discharged onto the substrate,
the performing pre-dispensing includes
detecting a temperature of the processing liquid before the temperature of the processing liquid in the pre-dispensing in progress reaches the target temperature, and
setting the discharge stop duration of the processing liquid in the pre-dispensing based on the target temperature prediction duration,
the target temperature prediction duration is prediction duration until the temperature of the processing liquid reaches the target temperature from the detection temperature,
the detection temperature is the temperature of the processing liquid detected, in the detecting, before the temperature of the processing liquid reaches the target temperature,
the target temperature prediction duration is determined based on the temperature profile, and
the temperature profile indicates a record of the temperature of the processing liquid changing over time when the pre-dispensing was performed in past according to the pre-dispensing condition.

10. The substrate processing method according to claim 9, wherein
in the setting, the target temperature prediction duration according to the detection temperature of the processing liquid is determined based on the temperature profile.

11. The substrate processing method according to claim 9, wherein
in the detecting, it is detected that the temperature of the processing liquid in the pre-dispensing in progress has reached a predetermined temperature,
the predetermined temperature is lower than the target temperature, and the performing pre-dispensing further includes stopping discharge of the processing liquid in the pre-dispensing when the target temperature prediction duration has elapsed since a time when it was detected that the temperature of the processing liquid had reached the predetermined temperature.

12. The substrate processing method according to claim 9, wherein
in the detecting, the temperature of the processing liquid is detected at a predetermined detection time in the pre-dispensing in progress,
the predetermined detection time is a time before the temperature of the processing liquid reaches the target temperature, and
the performing pre-dispensing further includes stopping discharge of the processing liquid in the pre-dispensing when the target temperature prediction duration has elapsed since the predetermined detection time.

13. The substrate processing method according to claim 9, wherein
in the performing pre-dispensing, the pre-dispensing is performed according to the pre-dispensing condition selected from pre-dispensing conditions, and
a pre-dispensing condition when temperature changing over time in the temperature profile is recorded is the same as the pre-dispensing condition selected.

14. The substrate processing method according to claim 9, wherein
in a case where a state of the substrate processing apparatus is a state indicated by state information, the temperature profile indicates a record of the temperature of the processing liquid changing over time when the pre-dispensing was performed in past according to the pre-dispensing condition, and
the state information includes at least one chosen from information indicating an elapsed time from completion of processing of a substrate processed immediately before and information indicating how many substrates have been held by the spin chuck in order to be processed one by one.

15. The substrate processing method according to claim 9, wherein
the processing liquid contains phosphoric acid or a mixture of sulfuric acid and hydrogen peroxide.

16. The substrate processing method according to claim 9, wherein
the performing pre-dispensing is performed for each of chambers, the substrate being contained in each of the chambers.

* * * * *